US011417829B2

(12) United States Patent
Kim et al.

(10) Patent No.: US 11,417,829 B2
(45) Date of Patent: *Aug. 16, 2022

(54) THREE DIMENSIONAL PERPENDICULAR MAGNETIC TUNNEL JUNCTION WITH THIN FILM TRANSISTOR ARRAY

(71) Applicant: Integrated Silicon Solution, (Cayman) Inc., Grand Cayman (KY)

(72) Inventors: Kuk-Hwan Kim, San Jose, CA (US); Dafna Beery, Palo Alto, CA (US); Amitay Levi, Cupertino, CA (US); Andrew J. Walker, Mountain View, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/984,133

(22) Filed: May 18, 2018

(65) Prior Publication Data

US 2019/0355896 A1    Nov. 21, 2019

(51) Int. Cl.
*H01L 43/02* (2006.01)
*H01L 43/12* (2006.01)
(Continued)

(52) U.S. Cl.
CPC ............ *H01L 43/02* (2013.01); *G11C 11/161* (2013.01); *H01L 27/228* (2013.01); *H01L 43/10* (2013.01); *H01L 43/12* (2013.01)

(58) Field of Classification Search
CPC ....... H01L 43/02; H01L 27/228; H01L 43/10; H01L 43/12; G11C 11/161
See application file for complete search history.

(56) References Cited

U.S. PATENT DOCUMENTS 6,882,566 B2 *  4/2005  Nejad ................... B82Y 10/00
                                                       257/E21.665
7,978,491 B2 *  7/2011  Nejad ................... B82Y 10/00
                                                       365/173
(Continued)

OTHER PUBLICATIONS

Yang et al., "Novel Selector and 3D RRAM Development for High Density Non-Volatile Memory," ECS Transactions, vol. 69, No. 5, 2015, pp. 165-168.
(Continued)

*Primary Examiner* — Bitew A Dinke

(57) ABSTRACT

A three dimensional magnetic random access memory array that includes a sourceline formed on a substrate and a magnetic memory element pillar that includes a plurality of magnetic memory element pillars formed over the substrate. The three dimensional magnetic random access memory array also includes a transistor formed between the magnetic memory element pillar, the transistor being functional to electrically connect the sourceline and magnetic memory element pillar. A plurality of magnetic memory element pillars may be formed over the substrate with a transistor between each memory element pillar to selectively connect or disconnect each of the magnetic memory element pillars. The transistor can include an epitaxial semiconductor structure having a gate dielectric formed at a side of the epitaxial semiconductor and a gate material formed on the gat dielectric such that the gate dielectric material is between the gate material and the semiconductor material.

14 Claims, 28 Drawing Sheets

(51) Int. Cl.
*H01L 43/10* (2006.01)
*G11C 11/16* (2006.01)
*H01L 27/22* (2006.01)

(56) References Cited

U.S. PATENT DOCUMENTS

| | | | |
|---|---|---|---|
| 9,082,888 B2 | 7/2015 | Kent et al. | |
| 9,520,561 B1 | 12/2016 | Kim et al. | |
| 9,887,237 B2 | 2/2018 | Sakai et al. | |
| 10,186,551 B1* | 1/2019 | Kim | H01L 27/228 |
| 10,333,063 B1* | 6/2019 | Kim | H01L 43/12 |
| 10,355,045 B1* | 7/2019 | Kim | H01L 27/228 |
| 10,629,649 B2 | 4/2020 | Kim et al. | |
| 10,658,425 B2* | 5/2020 | Kim | H01L 43/02 |
| 2003/0198080 A1* | 10/2003 | Iwata | G11C 11/15 |
| | | | 365/158 |
| 2003/0223292 A1* | 12/2003 | Nejad | B82Y 10/00 |
| | | | 365/200 |
| 2003/0227795 A1* | 12/2003 | Seyyedy | G11C 11/1659 |
| | | | 365/173 |
| 2005/0079721 A1* | 4/2005 | Buerger | H01L 27/105 |
| | | | 438/696 |
| 2006/0006439 A1* | 1/2006 | Ju | G11C 11/15 |
| | | | 257/295 |
| 2006/0039188 A1* | 2/2006 | Ju | G11C 11/16 |
| | | | 365/158 |
| 2008/0170432 A1* | 7/2008 | Asao | G11C 11/16 |
| | | | 365/171 |
| 2008/0209118 A1* | 8/2008 | Kajiyama | G11C 11/16 |
| | | | 711/105 |
| 2009/0279354 A1* | 11/2009 | Kanakasabapathy | G11C 11/15 |
| | | | 365/171 |
| 2010/0073025 A1* | 3/2010 | Tanamoto | H03K 19/1776 |
| | | | 326/41 |
| 2010/0109061 A1* | 5/2010 | Kushida | G11C 11/1659 |
| | | | 257/295 |
| 2010/0193891 A1 | 8/2010 | Wang et al. | |
| 2010/0244897 A1* | 9/2010 | Saito | H01L 43/10 |
| | | | 326/49 |
| 2011/0127484 A1* | 6/2011 | Yasutake | G11C 13/0002 |
| | | | 257/2 |
| 2011/0292715 A1* | 12/2011 | Ishihara | G11C 7/12 |
| | | | 365/148 |
| 2012/0112298 A1* | 5/2012 | Kim | G11C 11/02 |
| | | | 257/421 |
| 2012/0241826 A1* | 9/2012 | Satoh | H01L 43/02 |
| | | | 257/295 |
| 2013/0001652 A1 | 1/2013 | Yoshikawa et al. | |
| 2013/0056698 A1* | 3/2013 | Satoh | H01L 27/105 |
| | | | 257/2 |
| 2013/0250670 A1* | 9/2013 | Nakai | G11C 11/161 |
| | | | 365/158 |
| 2014/0299950 A1* | 10/2014 | Kim | H01L 27/228 |
| | | | 257/421 |
| 2015/0056368 A1 | 2/2015 | Wang et al. | |
| 2015/0206923 A1 | 7/2015 | Masuoka et al. | |
| 2015/0249154 A1* | 9/2015 | Kim | H01L 27/228 |
| | | | 257/295 |
| 2015/0340600 A1* | 11/2015 | Kim | H01L 43/10 |
| | | | 257/421 |
| 2016/0035789 A1* | 2/2016 | Mine | H01L 27/101 |
| | | | 365/148 |
| 2016/0233333 A1* | 8/2016 | Toh | H01L 43/12 |
| 2016/0248003 A1* | 8/2016 | DeBrosse | H01L 43/12 |
| 2016/0260774 A1 | 9/2016 | Umebayashi et al. | |
| 2016/0301002 A1* | 10/2016 | Hu | H01L 27/1052 |
| 2016/0372656 A1 | 12/2016 | Pinarbasi et al. | |
| 2017/0110651 A1 | 4/2017 | Park et al. | |
| 2017/0141157 A1* | 5/2017 | Sakai | H01L 27/226 |
| 2018/0277181 A1* | 9/2018 | Bedeschi | H01L 27/11502 |
| 2019/0115392 A1* | 4/2019 | Bruce | H01L 27/2409 |
| 2019/0189915 A1* | 6/2019 | Lin | H01L 43/12 |
| 2019/0206463 A1* | 7/2019 | Kim | G11C 11/161 |
| 2019/0206932 A1 | 7/2019 | Kim et al. | |
| 2019/0206934 A1 | 7/2019 | Kim et al. | |
| 2019/0221609 A1* | 7/2019 | Aggarwal | G11C 11/161 |
| 2019/0288033 A1* | 9/2019 | Sukekawa | H01L 21/02164 |
| 2019/0304974 A1* | 10/2019 | Sharma | H01L 27/1211 |

OTHER PUBLICATIONS

Kim et al., U.S. Appl. No. 15/859,114, filed Dec. 29, 2017.
Kim et al., U.S. Appl. No. 15/859,070, filed Dec. 29, 2017.
Corrected Notice of Allowance from U.S. Appl. No. 15/859,114, dated May 30, 2019.
Non-Final Office Action from U.S. Appl. No. 15/859,114, dated Sep. 7, 2018.
Notice of Allowance from U.S. Appl. No. 15/859,114, dated Mar. 4, 2019.
Notice of Allowance from U.S. Appl. No. 15/859,070, dated Dec. 17, 2019.

\* cited by examiner

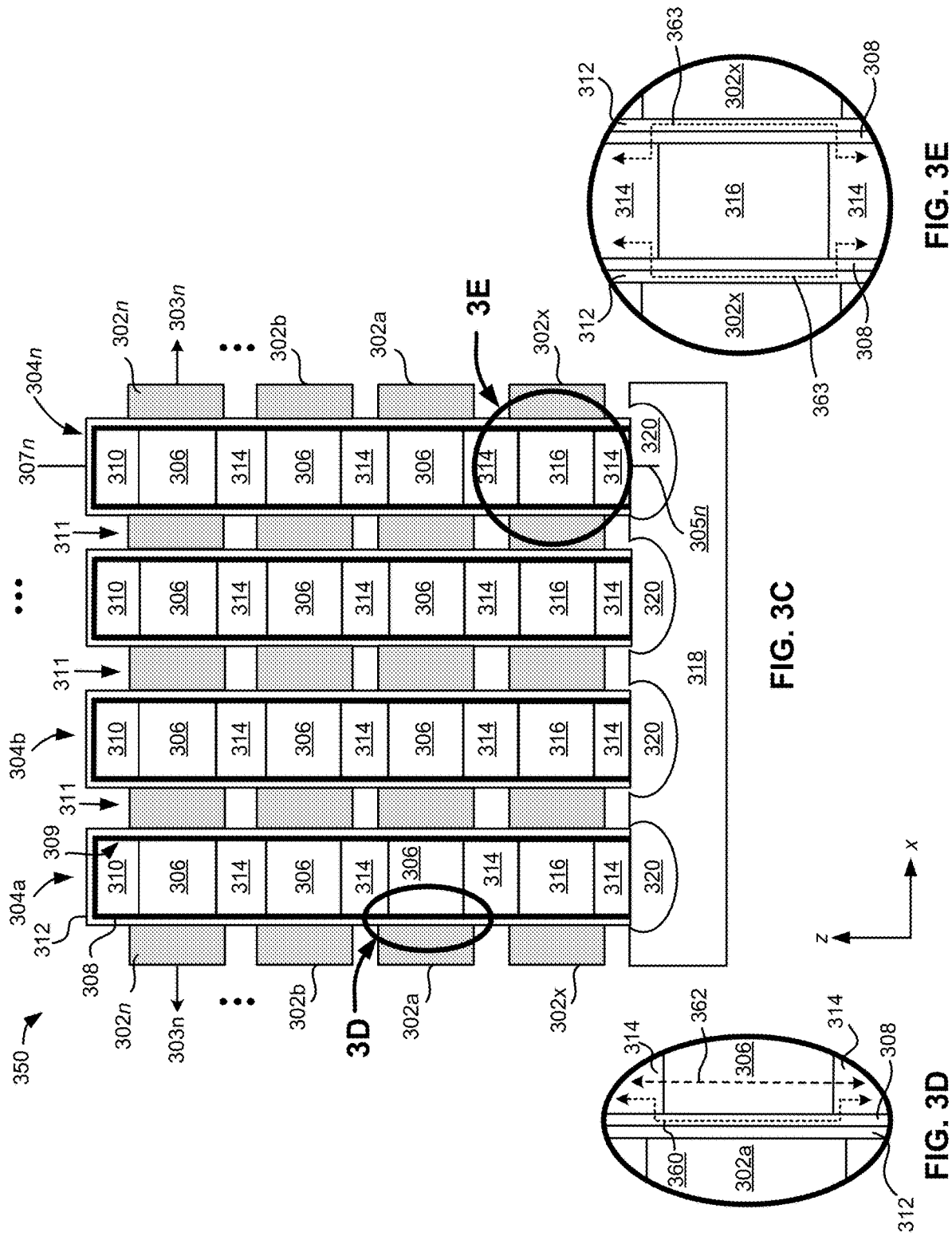

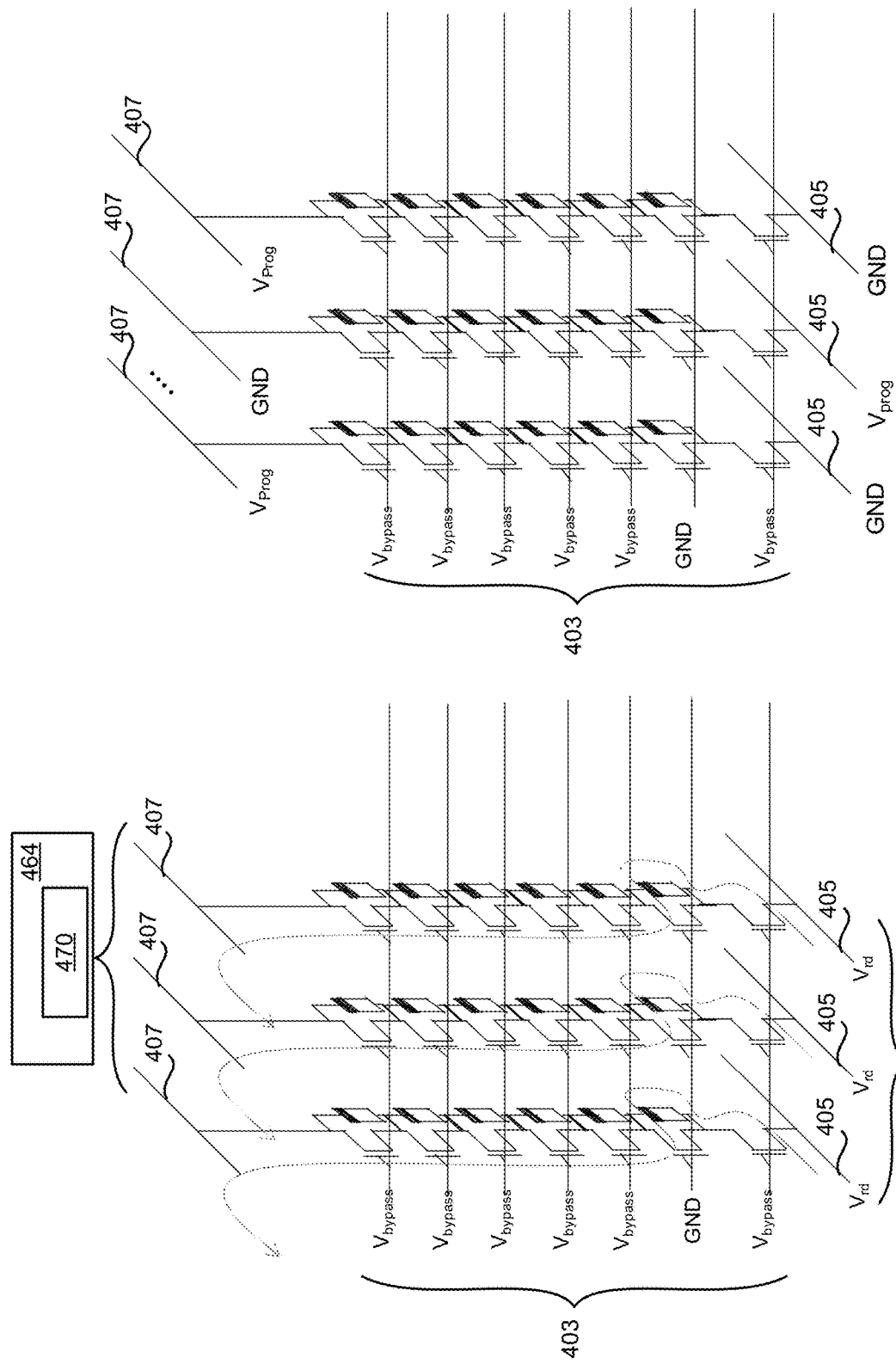

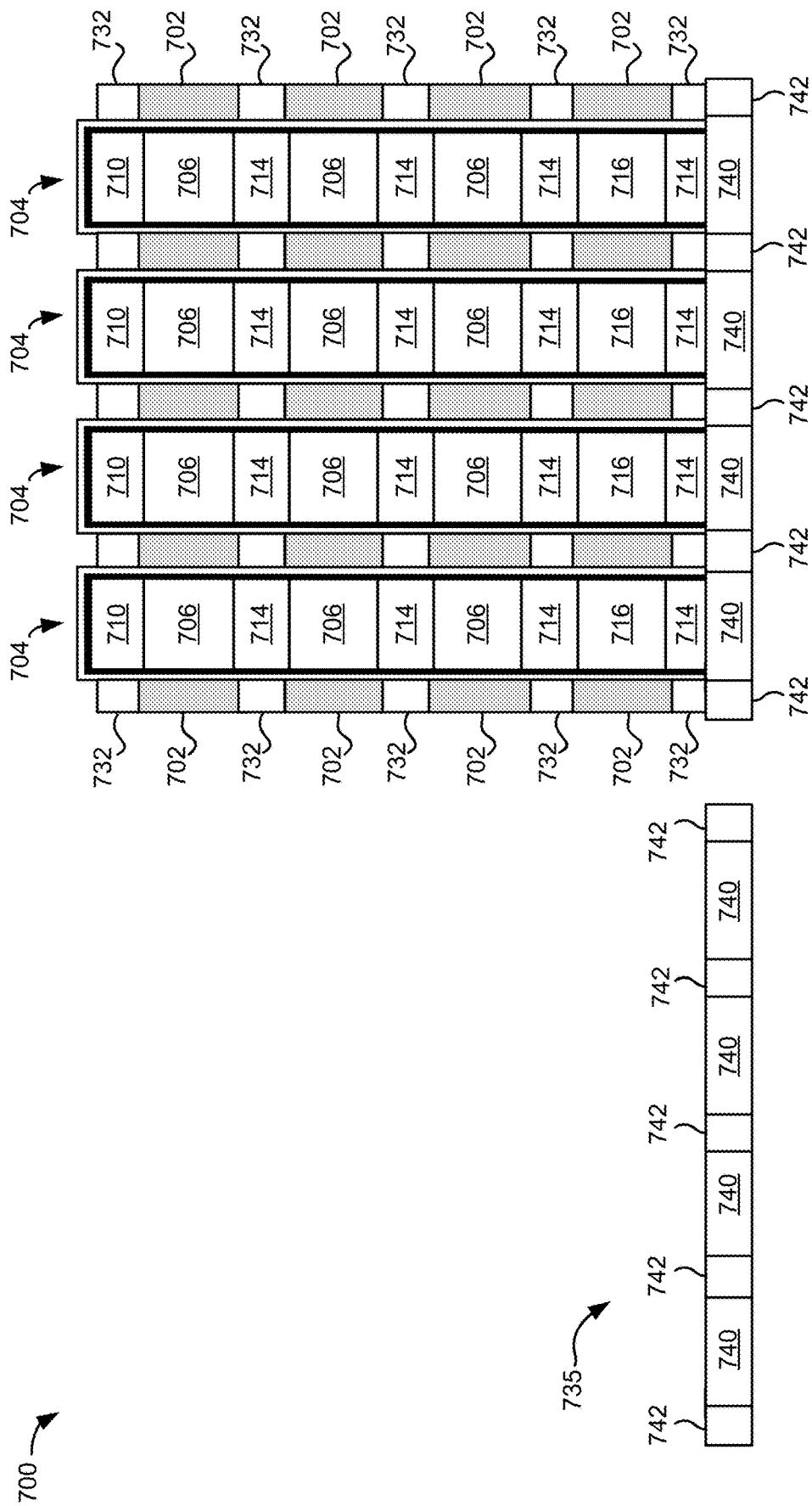

THREE DIMENSIONAL PERPENDICULAR MAGNETIC TUNNEL JUNCTION WITH THIN FILM TRANSISTOR ARRAY

FIELD OF THE INVENTION

The present invention relates to magnetic random access memory (MRAM), and more particularly to three-dimensional perpendicular magnetic tunnel junction with an epitaxially grown thin film transistor for source line selection.

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

The present invention provides a magnetic random access array that includes a substrate with a sourceline formed therein and further includes a pillar structure having a plurality of memory elements. A transistor, which includes an epitaxial semiconductor material is located between the pillar structure and the sourceline, the transistor being functional to selectively electrically connect the pillar structure with the sourceline.

The magnetic random access array can include a plurality of pillar structures each including a plurality of magnetic memory elements. Each of the plurality of magnetic memory elements can be electrically connected with an individual transistor located between the pillar structure and the sourceline, so that the transistors can be used to select individual pillar structures for activation either to read or write data.

The transistor can include an epitaxial semiconductor material and a gate dielectric and gate material layer formed at a side of the semiconductor material such that the gate dielectric layer is located between the gate material and the semiconductor material. The semiconductor can be Si. The gate dielectric can be one or more of $SiO_2$, $HfO_2$, $Al_2O_3$ and $ZrO_2$. The gate dielectric can be one or more of W, TiNi, TaN, TiN and Ti.

The magnetic random access memory array may can be constructed by a process that includes forming a sourceline in a semiconductor substrate, and depositing a dielectric layer over the substrate. A gate material can be deposited over the dielectric layer, and a dielectric fill material can be deposited. An etching can be performed to form at least one opening in the dielectric fill layer and gate material in at least one region over the sourceline. Then, an epitaxial semiconductor material can be deposited into the opening.

The semiconductor material can be Si. After growing the epitaxial semiconductor, a chemical mechanical polishing process (CMP) can be performed to planarize the surface and remove excess semiconductor material. After performing the CMP, a pillar structure can be formed over the semiconductor material, the pillar structure can be formed to include a plurality of magnetic memory elements separated from one another by buffer layers. The magnetic memory elements of the pillar structures can be perpendicular magnetic tunnel junction (TMJ) elements.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

FIG. 3C a schematic representation of a cross-sectional view of a portion of a MRAM, according to one embodiment.

FIG. 3D is magnified view of Circle 3D from FIG. 3C.

FIG. 3E is magnified view of Circle 3E from FIG. 3C.

FIG. 4A is a schematic representation of a transistor pattern during a Read Operation of a MRAM, according to one embodiment.

FIG. 4B is a schematic representation of a transistor pattern during a Write Operation of a MRAM, according to one embodiment.

FIGS. 7A-7B are schematic representations of cross-sectional views of a MRAM, according to one embodiment.

DETAILED DESCRIPTION

The following description includes the best embodiments presently contemplated for carrying out the invention. This description is made for the purpose of illustrating the general principles of this invention and is not meant to limit the inventive concepts claimed herein in any way.

According to one general embodiment, a method of forming a magnetic device includes forming a source region including a first semiconductor material having a first conductivity, forming an array of three-dimensional structures above the substrate, depositing a channel material on a surface of at least one sidewall of each three-dimensional structure, depositing a gate dielectric material on the channel material on the surface of at least one sidewall of each three dimensional structure, forming a first isolation region in the cavity region above the substrate, forming a first gate region above the first isolation region in the cavity region, and forming a second isolation region above the first gate region, wherein a $n^{th}$ gate region is formed above a (n+1) isolation region thereafter until a top of the array of three-dimensional structures, wherein each $n^{th}$ gate region is coupled to each $n^{th}$ perpendicular magnetic tunnel junction sensor of each three-dimensional structure.

In addition, forming each three dimensional structure includes forming layers above the source region in an order as follows: a first buffer layer, a dielectric layer, a second buffer layer, a first perpendicular-magnetic tunnel junction sensor, a third buffer layer, a $n^{th}$ perpendicular-magnetic tunnel junction sensor, a $(n+2)^{th}$ buffer layer, and defining an array of three-dimensional structures in the formed layers, wherein each three-dimensional structure comprises a stack of formed layers in a vertical direction above the substrate, wherein each three-dimensional structure has a bottom at the substrate, a top, and a sidewall extending between the bottom and the top, wherein a cavity region is formed between the sidewall of each adjacent three-dimensional structure.

Figure 1:
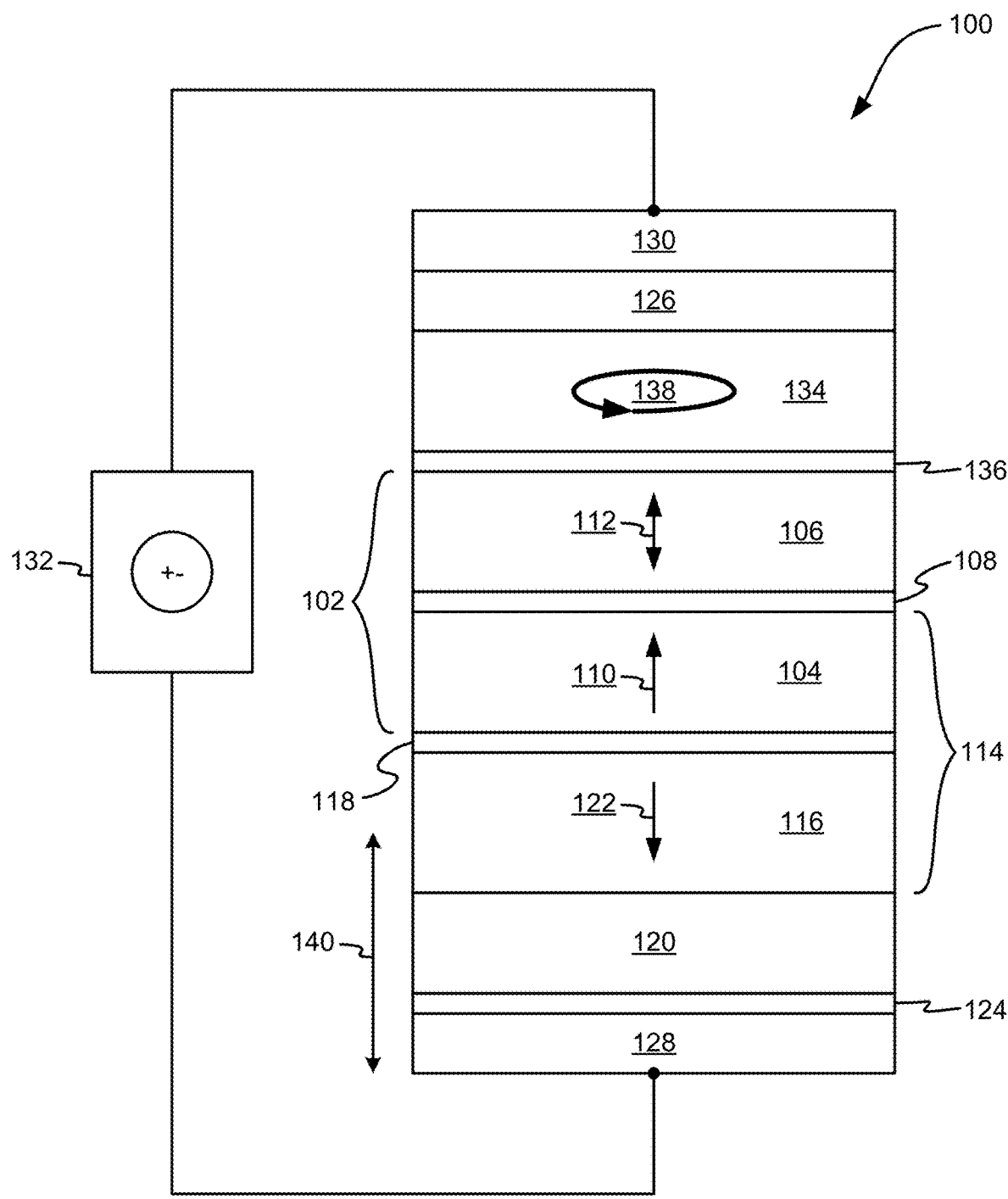
FIG. 1 is a schematic representation of a cross-sectional view of a portion of a magnetic memory element, which may be used in embodiments of the invention.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art.

The reference layer 104 has a magnetization 110 that is fixed in a direction that is perpendicular to a horizontal plane of the layer, as indicated by the arrow. The horizontal plane is sometimes referred to as a plane of formation in the embodiments described herein. The reference layer 104 may include CoFeB30 or CoFeB40, or some other suitable material known in the art.

The free layer 106 has a magnetization 112 that may be in either of two directions perpendicular to a horizontal plane of the free layer 106, as indicated by the two arrows. The free layer 106 may include CoFeB20/W/CoFeB20, or some other suitable material known in the art. While the magnetization 112 of the free layer 106 remains in either of two directions perpendicular to the plane of the free layer 106 in a quiescent state, it may be selectably switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru or a Ru/cobalt stack, and may be constructed to have a thickness that causes ferromagnetic antiparallel coupling of the pinned layer 116 and the reference layer 104. In some approaches, the pinned layer 116 may be a ferromagnetic layer, such as molybdenum (Mo) or cobalt (Co) coupled to reference layer 104 through antiparallel coupling layer 118.

In one approach, the pinned layer 116 may be exchange coupled with an antiferromagnetic layer 120, which may comprise any suitable material known in the art, such as IrMn. In some approaches, the AFM layer may be a series of layers of synthetic anti-ferromagnetic (SAF) materials, for example a SAF seed layer that includes platinum (Pt) and a set of SAF layers comprising alternating cobalt (Co)/Pt.

Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove. In one approach, a seed layer 124 may include Ta. In some approaches, an underlayer (not shown) may be positioned above the seed layer. In one approach, an underlayer may include Ru.

In another approach, a capping layer 126 may be positioned above the free layer 106 to protect the underlying layers during manufacture, such as during high temperature annealing. In some approaches, the capping layer 126 may include Ta/Ru, or some suitable material known in the art.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, TaN, Au, Ag, Cu, etc., and may provide an electrical connection with a circuit 132. The circuit 132 may include a current source, and may further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
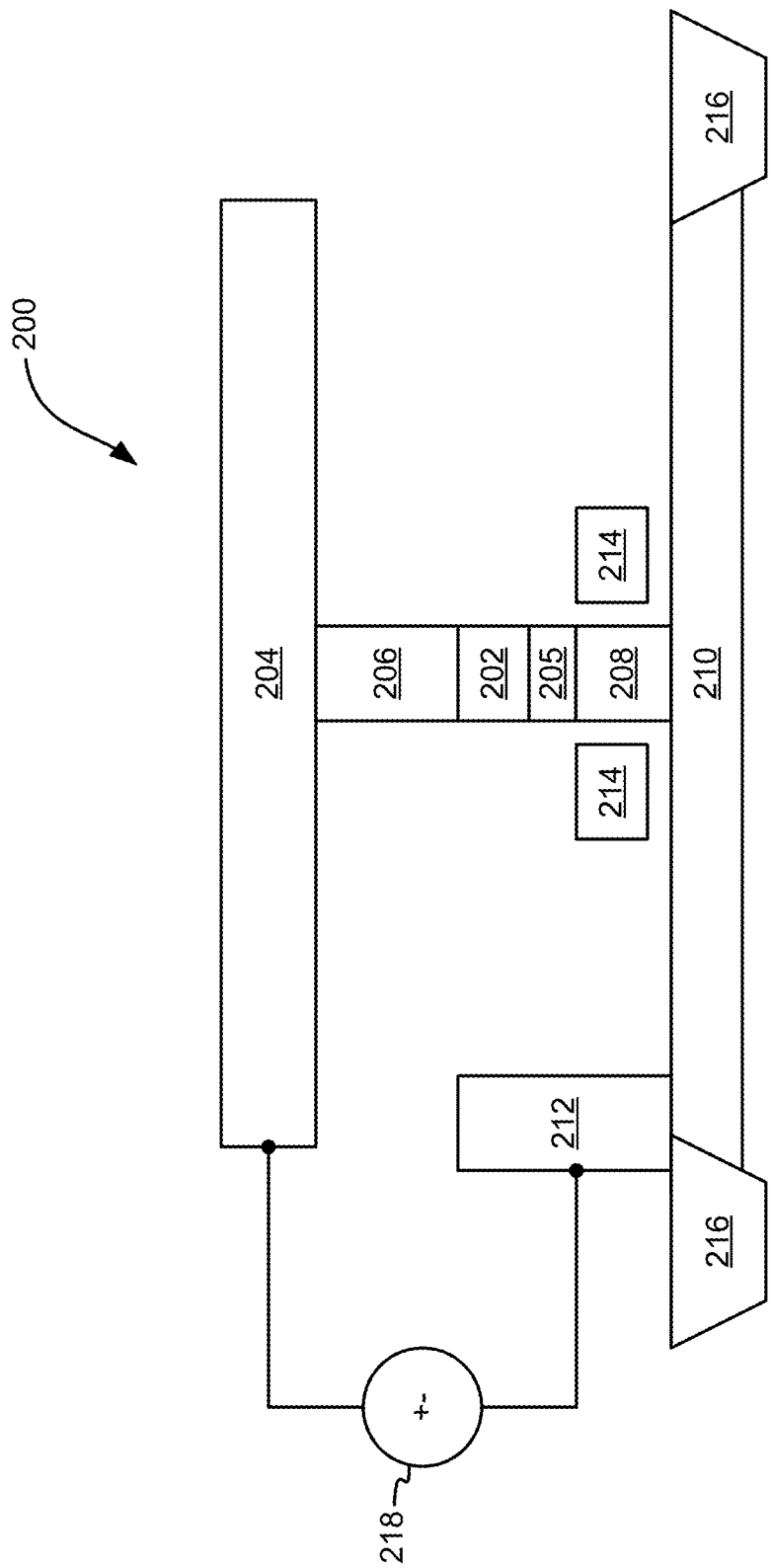
FIG. 2 is a schematic representation of a cross-sectional view of a portion of a magnetic random access memory (MRAM) that includes a magnetoresistive cell, which may be used in embodiments of the invention.

Now referring to FIG. 2, a portion of a magnetic random access memory (MRAM) structure 200 that includes a magnetoresistive cell 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive cell 202 of FIG. 2 in accordance with embodiments that store data in MRAM. In one embodiment, an MTJ element may be used as the magnetoresistive cell 202.

The MRAM cell 200 also includes a bitline 204 that supplies current across the magnetoresistive sensor stack 202 from a current source 218. The bitline 204 may include any suitable material known in the art, such as TaN, W, TiN, Au, Ag, Cu, etc. An extension layer 206 electrically connects the magnetoresistive sensor stack 202 with the bitline 204. The extension layer 206 may include any suitable material known in the art, such as Ru, Ta, etc. A source terminal 205 is coupled between the magnetoresistive sensor stack 202 and a channel layer 208, the channel layer 208 further being in electrical contact with a n+ layer 210. The channel layer 208 may include any suitable semiconductor material known in the art, such as Si, Ge, GaAs-compounds, etc. The n+ layer 210 may include any suitable material known in the art, such as phosphorous-doped silicon, arsenide-doped silicon, doped silicon cladded with TaN, W, TiN, Au. Ag, Cu, etc., and is electrically connected to the voltage source 218 via a sourceline 212, which may include any suitable material known in the art, such as TaN, W, TiN, Au, Ag, Cu, etc. Positioned across the channel layer 208 is a word line 214 which may include any suitable material known in the art, such as TaN, W, TiN, Au, Ag, Cu, etc. On either side of the n+ layer 210 are shallow trench isolation (STI) layers 216 which provide electrical insulation between adjacent the n+ layer 210. Moreover, although not specifically shown, electrically insulative material may be positioned around the various layers shown in FIG. 2, as would be understood by one of skill in the art.

The development of arrays of three-dimensional (3D) structures that include multiple perpendicular (pMTJ) sensors provides higher density of non-volatile memory in an MRAM array. Conventional methods to form the arrays of 3D structures of multiple pMTJ sensors has been challenging due to limitations of processing temperature of pMTJ sensors. Studies of p-MTJ engineering have shown that the p-MTJ structure can only withstand temperatures under 400° C. and duration of processes to not exceed 3 hours. Several degradation processes of the pMTJ sensor structure will occur when the structure is exposed to thermal conditions that exceed 400° C. and/or 3 hours of processes. For example, under these extreme conditions, the 3D structures of pMTJ sensors will experience inter-metallic diffusion along the stack of pMTJ sensors, sidewall etch byproduct diffusion, boron dopant diffusion from free/reference layer pin-hole formation through MgO, etc. Thus, it would be desirable to be able to form an array of 3D structures of stacked pMTJ sensors at lower temperatures and shorter processing times.

Various embodiments described herein present a MRAM device that includes an array of 3D structures in which each 3D structure has alternating pMTJ sensors with ohmic contact layers in a vertical direction. The methodology as described herein to form the array of 3D structures includes simple alternating thin-film deposition. In some approaches, as will be described below, the alternating thin-film deposition may be deposited in a single chamber, thereby resulting in a high yield of wafer production. In sharp contrast, conventional methods of formation of 3D structures for MRAM devices involve multiple chambers for deposition of layers of the 3D structures and thus result in longer production times.

Furthermore, as various embodiments describe herein, a parallel connection of pMTJs and thin film transistor in all vertical levels of each 3D structure may be formed in a single step conformal channel deposition over the pillar shape of the 3D structure. According to various embodiments, the methodology to form an array of 3D structures as described provides a highly efficient process to create high density bit/cell arrays thereby reducing wafer production costs in memory technology.

Thus, as presented below, a plurality of pMTJ cells may be vertically stacked and etched into long pillars in a single step. Further, the shortened processing time as described will allow cost effective formation of multiple pMTJ devices, with each 3D structure including greater numbers of pMTJ cells. According to one embodiment, a processing method allows alternating deposition of a pMTJ and an inter-pMTJ conducting buffer layer deposition without component element diffusion and structural defects.

Figure 3B:
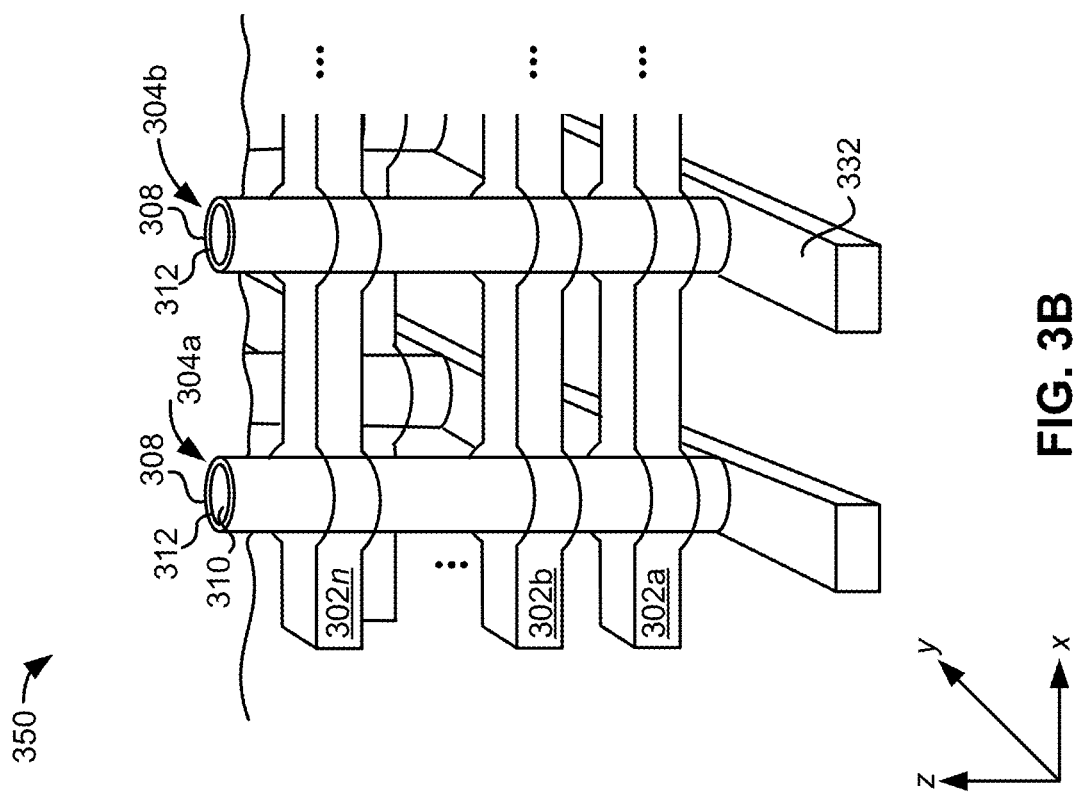
FIG. 3B is a schematic representation of a bird's eye view of multiple vertical channels of a portion of a magnetic memory device, according to one embodiment.
Figure 3A:
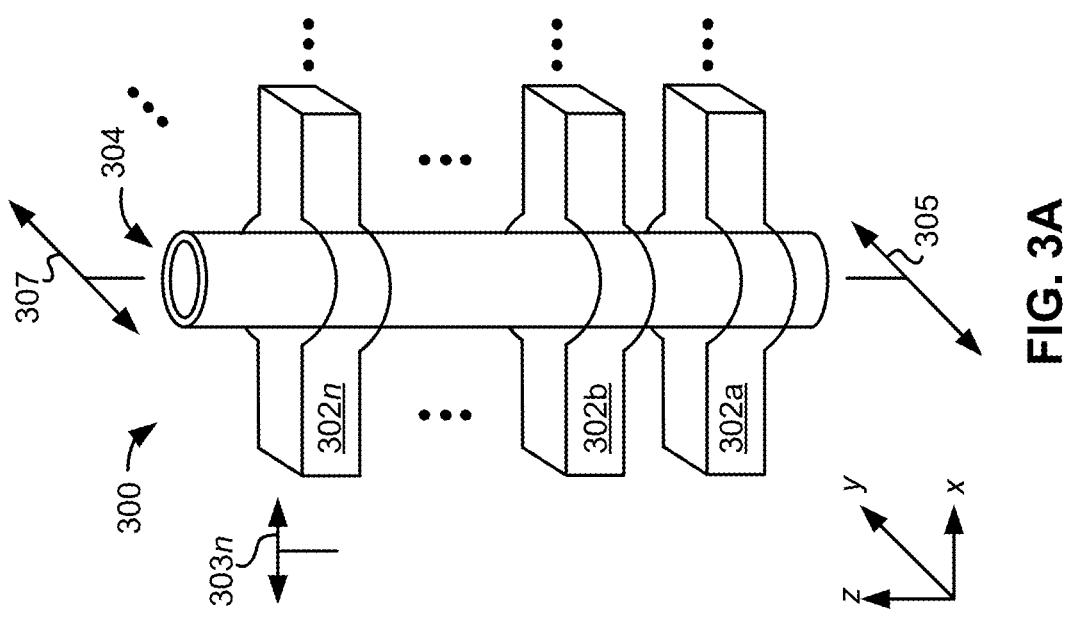
FIG. 3A is a schematic representation of a bird's eye view of a vertical channel of a portion of a MRAM, according to one embodiment.

Now referring to FIG. 3A, a bird's eye view of a portion of a MRAM structure 300 that includes a vertical 3D structure of multiple stacked pMTJ sensors is shown according to one embodiment. The MRAM structure 300 may be operated and utilized as understood by those of skill in the art, with any special use cases being specified in accordance with an embodiment herein. The memory element 100 described in FIG. 1 may be used as a memory element in accordance with embodiments that store data in MRAM. In one embodiment, an MTJ element may be used as the magnetoresistive cell.

FIG. 3B illustrates a bird's eye view of a larger portion of the magnetic memory device 350 showing a plurality of 3D structures 304a, 304b. Each of the 3D structures 304a, 304b may be formed adjacent to each other in the x-direction with multiple gate regions 302a, 302b-302n. Forming a grid array, the 3D structures may also be formed adjacent to each other in the y-direction along an electrode 332 in the y-direction. As shown in FIG. 3A, each gate region 302n may have gate wordlines 303 parallel at each vertical level.

FIG. 3C represents a schematic drawing of a cross-sectional view of a larger portion of a magnetic memory device 350, according to one embodiment, showing multiple 3D structures 304a, 304b-304n and associated gate regions 302a, 302b-302n. According to various embodiments, a gate region may include one or more gate layers.

Looking back to FIG. 3A, according to one embodiment, the structure 300 is shown as one 3D structure 304 where a sourceline 305/bitline 307 may be in the vertical direction of the 3D structure 304. The gate region 302a, 302b-302n may be positioned orthogonal to the vertical direction of the 3D structure 304 and a sourceline 305/bitline 307. The locations of the sourceline 305/bitline 307 are drawn together as the lines run parallel in the vertical direction of each 3D structure. However, it is important to note that the sourceline 305 is not connected to the bitline 307 within the vertical 3D structure, but may be connected in an associated circuit, as shown later in FIG. 3F. Operation voltage or current may be applied to bitline 307 or sourceline 305 separately. Each gate region 302a, 302b-302n may be coupled to a portion of the 3D structure 304 where a magnetoresistive cell may be positioned. In some approaches, the magnetoresistive cell may be a pMTJ sensor 306, as shown in FIGS. 3C and 3D.

In one embodiment, a 3D structure 304 may include a hardmask layer 310 (FIG. 3C) at the top portion of the 3D structure 304. Along the sidewall of the 3D structure 304 may be channel material 308 with a gate dielectric material 312 that couples the gate region 302a, 302b-302n with the 3D structure 304. In some approaches, the 3D structure 304 may include silicon.

According to one embodiment, a magnetic device includes a substrate having a source region with a first conductivity. Looking to the drawing in FIG. 3C, the array of 3D structures 304a, 304b-304n may be positioned in a vertical direction above a substrate 318 that includes a source region 320. In some approaches, the substrate 318 includes a semiconductor material, for example, silicon. In some approaches, the source region may have a n+ type conductivity. In other approaches, the conductivity of the source region may be a metal.

According to one embodiment, each 3D structure 304 includes a series of layers stacked in a vertical direction, wherein the vertical direction is a z-direction orthogonal to an xy plane of the substrate. Each 3D structure 304 may include dielectric layer positioned above the substrate, a plurality of a set of magnetic tunnel junction layers positioned above the dielectric layer, and a buffer layer positioned in between each set of magnetic tunnel junction layers thereof.

Each 3D structure may include a channel material on a surface of at least one sidewall of each 3D structure and a gate dielectric material positioned on the channel material on the surface of at least one sidewall of each 3D structure.

Looking to FIGS. 3A-3B, each 3D structure 304a, 304b-304n may be a pillar. In preferred approaches, each 3D structure 304 may be a cylindrical pillar. In various approaches, a 3D structure 304a, 304b-304n may include a dielectric layer 316 positioned above the substrate 318 and below the first pMTJ sensor 306. In some approaches for optimal memory operation, the 3D structure of stacked pMTJ sensors 306 may be isolated from the source region 320 (source-line) with a dielectric layer 316 therebetween. Thus, the portion of each 3D structure 304a, 304b-304n including the buffer layer 314 and the dielectric layer 316 may be isolated from source region 320 (sourceline) by a sourceline selector transistor, as shown in FIG. 3E. A source line transistor may form a source line channel 363 (dashed line).

Each 3D structure 304a, 304b-304n may have a plurality of pMTJ sensors 306. For example, but not meant to be limiting, each vertical channel may include stacks of pMTJ sensors 306 in multiples of 4, 8, 16, etc.

In one approach, a pMTJ sensor 306 may include the following layers: a seed layer, an underlayer, a synthetic antiferromagnetic seed layer, a synthetic antiferromagnetic layer, an antiferromagnetic coupling layer, a ferromagnetic coupling layer, a reference layer, a barrier layer, a free layer, and a capping layer. In some approaches, each layer may include multiple layers. It is important to note that the layers of the pMTJ sensor 306 as disclosed herein serve only as an example and are not limiting in any way, as various embodiments may include additional or less layers to form a pMTJ sensor. In some approaches the bottom layer (e.g. bottom electrode, seed layer, etc.) and/or top layer (e.g. upper electrode, capping layer, etc.) of each pMTJ sensor may include TaN.

In one embodiment, each 3D structure 304a, 304b-304n may include a buffer layer 314 positioned above and below each pMTJ sensor 306 stack. In some approaches, the buffer layer 314 may be conductive. In some approaches, the buffer layer 314 may include a metallic material. For example, but not meant to be limiting, the buffer layer 314 may include Ni, Au, Pt, Al, or a combination thereof. In some approaches, the buffer layer 314 may include an intermetallic layer. For example, but not meant to be limiting, the buffer layer 314 may include Ni/Au, Ti/Al, Ta/Au, or a combination thereof.

The upper layer of each 3D structure may include a hardmask layer 310. In some approaches, the hard mask layer 310 may include one of the following TaN, TiN, or a combination thereof.

In some embodiments, the 3D structure 304a, 304b-304n may include a channel material 308 on a surface of at least one sidewall 309 of each 3D structure. In some approaches, the channel material 308 may include $InZnO_2$, ZnO, InZnGaO, or a combination thereof.

In addition, the 3D structure 304a, 304b-304n may include a gate dielectric material 312 on the channel material 308 on the surface of at least one sidewall 309 of each 3D structure. In some approaches, the gate dielectric material 312 may include $SiO_2$, $ZrO_2$, $HfO_2$, $Al_2O_3$, or a combination thereof.

In an exemplary approach, the buffer layer 314 of the 3D structure forms a low barrier Schottky contact with the channel material 308 on the sidewall 309 of the 3D structure. Preferably, the buffer layer 314 forms an ohmic contact with the channel material 308 on the sidewall 309 of the 3D structure.

In one embodiment, as depicted in FIG. 3C, each 3D structure 304a, 304b-304n may have a bottom at the surface of the substrate 318, a top at the top layer of a hardmask layer 310, and a sidewall 309 extending between the bottom and the top, wherein a gate region 302a, 302b-302n of each vertical level a-n may extend across a cavity region 311 between at least one sidewall 309 of each adjacent 3D structure 304a, 304b-304n in an x-direction, wherein the x direction is orthogonal to a y-direction in the xy plane. The gate region 302a, 302b-302n may be coupled to at least one sidewall 309 of each 3D structure 304a, 304b-304n in the x-direction.

According to one embodiment, each gate region 302a, 302b-302n may be coupled to the gate dielectric material 312 of each 3D structure 304a, 304b-304n.

As shown for the 3D structure 304n in FIG. 3C, each vertical level of a gate region 302a-n may form a gate wordline 303a-n that may serve as gate electrodes of the transistor, according to one embodiment. For example, a gate region 302a represents the gate region in the $1^{st}$ vertical level of the 3D structure 304a, 304b-304n. The gate region 302x represents the gate region of the dielectric layer 316 of the 3D structures 304a, 304b-304n.

Looking back to FIG. 3A, a sourceline 305/bitline 307 may be a vertical channel of each 3D structure 304a, 304b-304n. The gate wordline 303n functions in each gate region 302n, such that the gate wordline 303n is orthogonal to the sourceline 305/bitline 307.

Looking to inset FIG. 3D from the Circle 3D of FIG. 3C, a cross-section of a thin film transistor channel is shown. FIG. 3D illustrates a portion of each 3D structure 304a, 304b-304n at a buffer layer 314 and a pMTJ sensor 306 at certain vertical level in certain gate bias configurations. In one approach, a transistor channel may be formed by touching channel material 308 with gate region 302a. In exemplary embodiments, a wordline channel layer may be formed at points where the gate region 302a is touching the gate dielectric material 312 that is positioned along the channel material 308 at the sidewall 309 of the pMTJ sensor 306 in the 3D structure 304a, 304b. In instances when the voltage of the wordline is high, the transistor channel is turned on, and thus a bypass channel 360 (small dash line). In such a case, the pMTJ sensor 306 is not included in the channel.

In another approach, when the voltage of the wordline is low, the transistor channel is turned off, and thus a pMTJ channel 362 (large dash line) may be formed. In such a case the pMTJ sensor 306 is included in the channel.

In some approaches, the bypass channel 360 in every vertical level of the 3D structures 304a, 304b-304n and gate region 302a, 302b-302n may have a source contact and a drain contact formed by the ohmic contact material of the buffer layer 314. In other approaches, the pMTJ channel 362 in every vertical level of the 3D structures 304a, 304b-304n and gate region 302a, 302b-302n may have a source contact and a drain contact formed by the ohmic contact material of the buffer layer 314. In various approaches, the source contact and drain contact may be interchangeable in the symmetric transistor. For example, whenever one terminal has higher electrical potential than the other, the higher potential terminal may be regarded as a drain. In one approach, under a particular bias condition, a drain terminal of a lower level channel may also be viewed as a source terminal of one level higher channel in which the metal in the buffer layer may be bridging two channels in the adjacent vertical level.

In one embodiment, each gate region 302a, 302b-302n may include a second semiconductor material having a second conductivity. In some approaches, the semiconductor material of the gate region 302a, 302b-302n may be the same as or different from the semiconductor material of the source region 320. In some approaches, the conductivity of the gate region 302a, 302b-302n may be a n-type conductivity. In other approaches, the conductivity of the gate region 302a, 302b-302n may be a metal. Further, the conductivity of the semiconductor material of the gate region 302a, 302b-302n may be the same as or different from the conductivity of the semiconductor material of the source region 320.

In some approaches, the semiconductor material of the gate material of the gate region 302a, 302b-302n may be the same as or different from the semiconductor material of the source region 320. In some approaches, the gate material of the gate layer may include W, TiNi, TaN, TiN, and Ti.

In one embodiment, the gate region may have an isolation region above and below the gate region. In some approaches, the isolation region may include a semiconductor material. In some approaches, the isolation material may be the same as or different from the semiconductor material of the substrate.

Figure 3F:
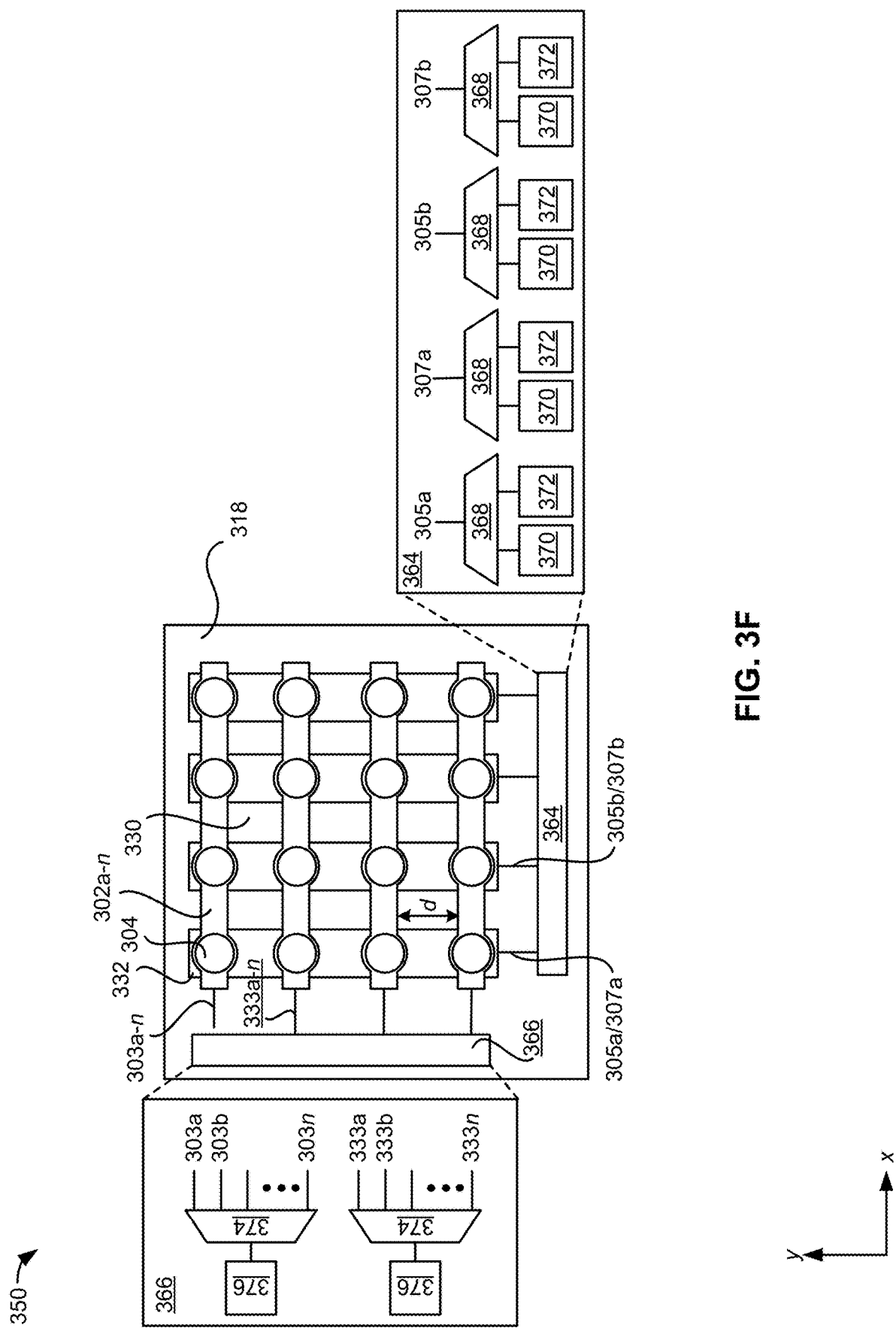
FIG. 3F is a top-down view of the magnetic memory device of FIG. 3C, according to one embodiment.

FIG. 3F illustrates a top down view of a magnetic memory device 350 including a portion of an array of the 3D structures 304 having cavity regions 311 there between, according to one embodiment. In some approaches, the 3D structures 304 may be arranged in a hexagonally close packed (HCP) array, a square array, or arranged in any other suitable configuration as would become apparent to one skilled in the art upon reading the present disclosure.

Looking to FIG. 3F, in an exemplary approach, the 3D structures may be formed at a distance d in the y-direction in order to prevent a wordline bridge from forming between adjacent 3D structures in the y-direction. If two 3D structures are formed too close together in the y-direction, then the gate wordlines of the parallel gate regions in the y-direction between each 3D structure may bridge thereby forming a wordline bridge.

As particularly shown in FIG. 3F, an isolation material may be present in a portion of the cavity region 311 (see FIG. 3C) between the 3D structures 304. In various approaches, the isolation region material present in the cavity regions 311 may extend the full distance between adjacent 3D structures 304 such that the isolation region material is in contact with both adjacent structures.

As evident from FIG. 3F, the sourceline 305a, 305b and bitline 307a, 307b of each 3D structure 304 may be connected to a sourceline/bitline circuit 364 via source wires or a continuous plane of metal (a source metal layer). A sourceline/bitline circuit 364, as shown in the expanded view, may have multiple pairs of sense amplifiers 370 and bias generation block 372 per bitline 307a, 307b and sourceline 305a, 305b. The sense amplifier 370 and bias generation block 372 may be muxed 368 so that either sense amplifier or bias generation block may be activated depending on the target operation (e.g. program operation, read operation, etc.). Each bitline 307a, 307b may be connected with a plurality of a drain terminals (e.g. the top portion of pMTJ) of transistors positioned in the direction of running bitline 307a, 307b. Each sourceline 305a, 305b may be connected with a plurality of a source terminals of multiple transistors in the direction of sourceline 305a, 305b. Moreover, each wordline 303a, 303b may connect the gate electrode with a plurality of transistors in the row direction.

In some approaches, each 3D structure 304 in a single column along an electrode 332 in a y-direction may be connected by a sourceline 305 or bitline 307 for each 3D structure. As also evident from FIG. 3F, the gate regions 302 may surround each of the 3D structures 304 and may be connected to one another and to a wordline driver circuit 366 via gate wires or a continuous plane of metal (a gate metal layer). As shown in the expanded view of the wordline driver circuit 366, the voltage/current for wordlines may be generated and selectively activated based on target address in the memory array.

For a magnetic memory device 350, there will be n-wordlines per row because of vertical stacking, for example wordline 303a indicates a wordline in the first row at the $1^{st}$ vertical level, wordline 303b indicates a wordline in the first row at the $2^{nd}$ vertical level, and at the top, wordline 303n indicates a wordline in the first row at the $n^{th}$ vertical level. Further, wordline 333a indicates a wordline in the second row at the $1^{st}$ vertical level, wordline 333b indicates a wordline in the second row at the $2^{nd}$ vertical level wordline, and 333n indicates a wordline in the second row at the $n^{th}$ vertical level.

As shown in the wordline driver circuit 366, a bias generation block 376 may generate bypassing wordline voltage and GND. A demux 374 in the gate driver may be designed so that unselected wordlines may be automatically biased with bypassing wordline voltage from bias generation block 376. In some approaches, a selected wordline may be biased to GND by demux 374 block.

In some approaches, each 3D structure in a single row of a gate region 302 in an x-direction may be connected by a wordline 303 of the gate region 302.

According to various embodiments, the magnetic memory device 350 as described herein may have $4F^2$ to $6F^2$ architecture such that a memory cell functions at each and every possible location, that being each and every crossing of a wordline and a bitline.

FIGS. 4A and 4B show examples of a sourceline/bitline map of the magnetic device during a Read Operation and a Write Operation, respectively, according to one embodiment. A memory operation, including writing information, erasing information, and reading information includes mechanisms for selectively selecting target physical memory cells which may be physically located in different vertical levels. Therefore, various embodiments described herein demonstrate a legitimate memory operation (e.g. writing, erasing, and reading) on all physical memory cells. A plurality of vertical channels may be connected by a pair of a sourceline 405 and a bitline 407 in the direction of the pair may be run. Wordline 403 may be running in an orthogonal directional to pairs of a bitline 407 and a sourceline 405, thereby allowing a capability of selecting physical memory cells at each and every intersection of wordline 403 and pairs of a bitline 407 and a sourceline 405. Moreover, a plurality of wordlines 403 may be formed in the vertical direction. In a preferred embodiment, physical memory cells located at only one vertical level may be activated per memory operation without disturbing the state of memory cell in other vertical levels. By applying bypassing signals on all unselected wordlines, thin film transistor channels may be turned on and subsequently forming bypassing channels all the way to the target memory cell. The bypassing channels may be programmatically configurable to form a conducting channel along vertical channel in a way that voltage and current biasing applied by bitline or sourceline may be directed only to target memory cells.

As shown in the Read Operation of FIG. 4A, sourcelines 405 may be biased at read voltage, Vrd, by a circuit 464. This read bias may be applied across target pMTJ. Read current, determined mainly by the resistance state of the selected pMTJ cell, may be picked up by bitlines 407 and eventually delivered to the circuits 464. Therefore, in this operation, sourceline 405 may be connected by bias generation block 472 in the circuit 464 whereas bitlines 407 may be connected to sense amplifier 470 in the circuit 464.

As shown in the Write Operation of FIG. 4B, State '1' (high-resistance state) may be written into pMTJ if current flow through pMTJ is upward whereas state '0' (low-resistance state) may be written into pMTJ if current flow through pMTJ is downward. In this bias configuration, bit sequence of '010' may be written into the first vertical level pMTJ in the first, second, third pillar.

Figure 5A:
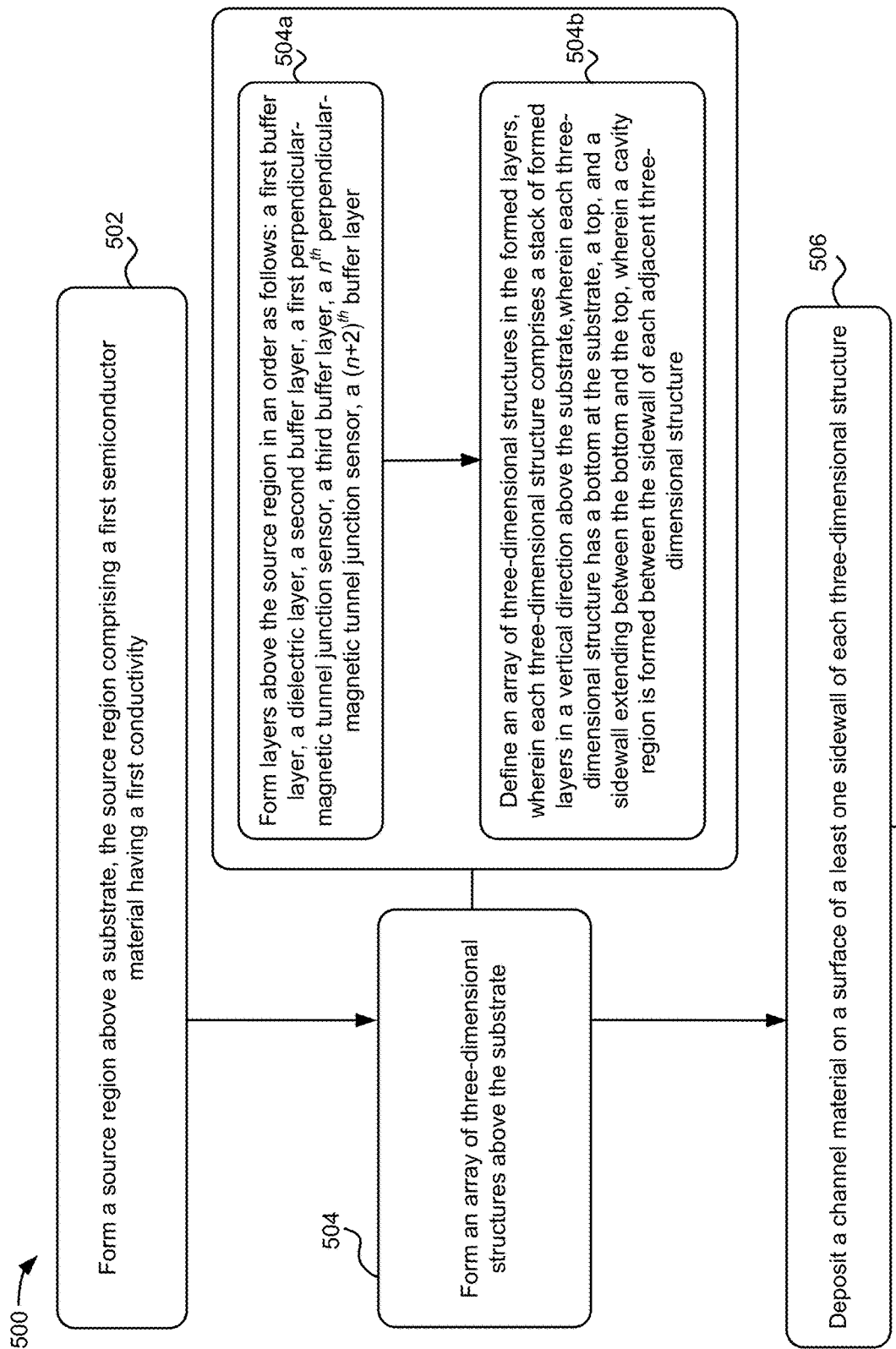
FIG. 5A is a flow chart of a method, in accordance with one embodiment.
Figure 5B:
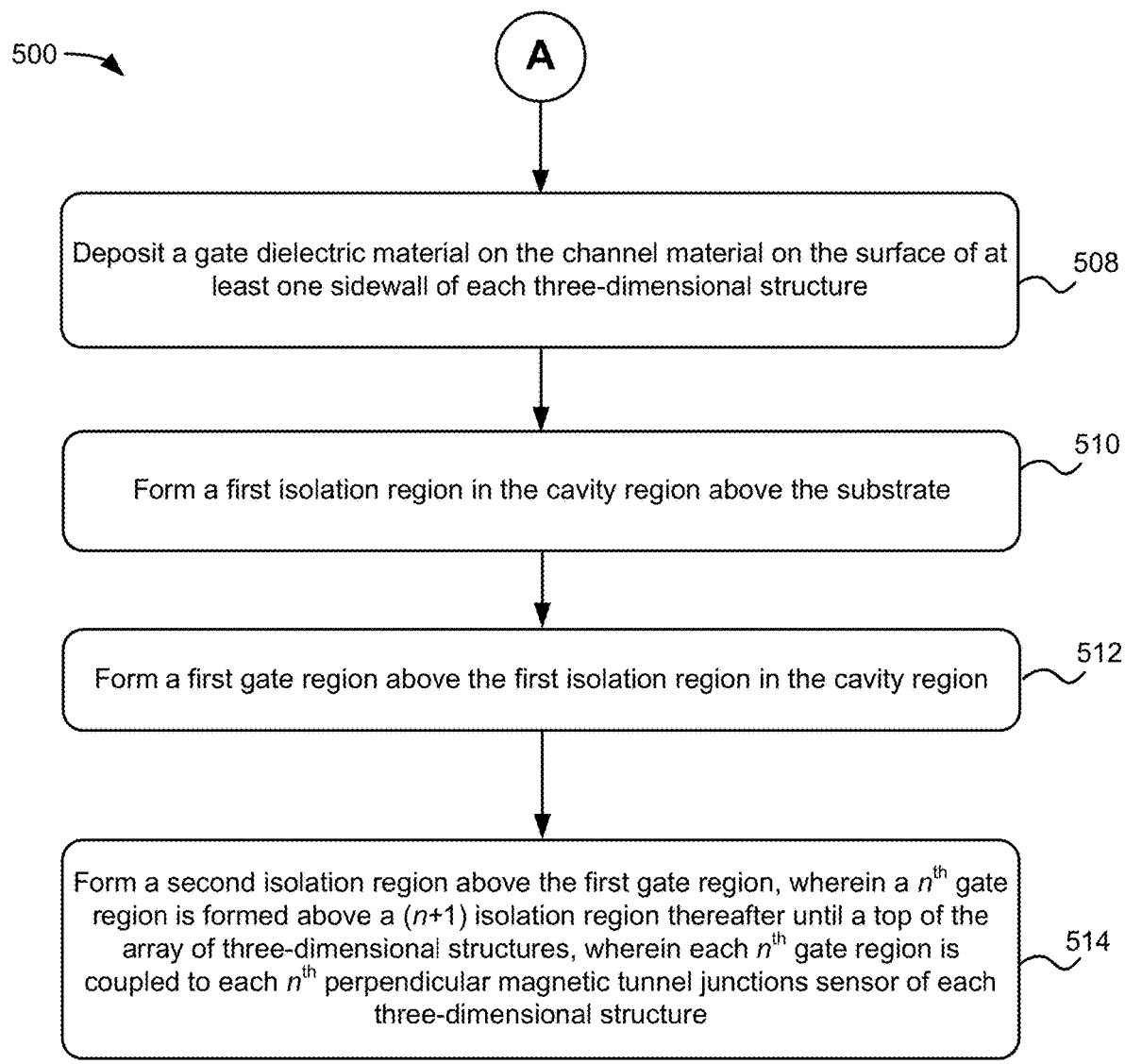
FIG. 5B is a continued flowchart from FIG. 5A of a method, in accordance with one embodiment.

Now referring to FIGS. 5A-5B a method 500 for forming a magnetic device is shown according to one embodiment. The method 500 may be performed in accordance with the present invention in any of the environments depicted in FIGS. 1-4, among others not specifically described, in various approaches. Of course, more or less operations than those specifically described in FIGS. 5A-5B may be included in method 500, as would be understood by one of skill in the art upon reading the present descriptions.

Looking to FIG. 5A, method 500 may begin with operation 502. Operation 502 includes forming a source region above a substrate, the source region comprising a first semiconductor material having a first conductivity. In some approaches, where the first conductivity may have an n-type conductivity. In other approaches, where the first conductivity may be a metal.

Operation 504 includes forming an array of three-dimensional structures above the substrate. Operation 504 involves two sub-operations, 504a and 504b as described below.

Operation 504a involves forming layers above the source region in an order as follows: a first buffer layer, a dielectric layer, a second buffer layer, a first perpendicular-magnetic tunnel junction sensor, a third buffer layer, a $n^{th}$ perpendicular-magnetic tunnel junction sensor, a $(n+2)^{th}$ buffer layer. In various approaches, forming of the pMTJ sensors may include deposition of the following layers: a seed layer, an underlayer, a synthetic antiferromagnetic seed layer, a synthetic antiferromagnetic layer, an antiferromagnetic coupling layer, a ferromagnetic coupling layer, a reference layer, a barrier layer, a free layer, and capping layer. In one embodiment, materials that comprise a pMTJ stack may be deposited in a single physical vapor deposition (PVD) chamber with several different target materials, for example Mo, Ru, Mg, Ta, Co, Fe, B, etc.

In one approach, operation 504a of forming the layers of the 3D structures includes thin-film deposition may involve atomic layer deposition in a single chamber at room temperature. In another approach, operation 504a of forming the layers of the 3D structures includes thin-film deposition may involve plasma-enhanced chemical vapor deposition, preferably in a single chamber at room temperature. In exemplary approaches, the deposition of pMTJ sensor stacks may not heat the substrate inside the deposition chamber while deposition occurs. Thus, preferably, the temperature of deposition may remain below 100° C. while pMTJ sensor stack layers are being deposited.

According to various approaches of operation 504a, the dielectric layer formed above the substrate may include $SiO_2$, $Si_3N_4$, $HfO_2$, $Al_2O_3$, etc.

Forming a buffer layer involves depositing the buffer layer above each pMTJ sensor stack so that the layers of buffer and pMTJ sensor alternate in a vertical direction. In various approaches, the buffer layers include ohmic contact material that extends in the vertical direction and may include TaN, TiN, W, Ru. etc. The layers of buffer layer may be the same or different within each 3D structure. The ohmic contact material of the buffer layer may be deposited on the pMTJ sensor stack layers using methods known by one skilled in the art including evaporator, sputter, etc. Notably, deposition of the buffer layer may be done at room temperature, thereby maintaining a low temperature environment during operation 504a. Thus, the alternate deposition of pMTJ sensor stack layers and ohmic contact material of the buffer layer may maintain the integrity of the pMTJ sensors.

In some approaches, the buffer layer may be an inter-pMTJ conducting buffer layer. In an exemplary approach, the buffer layer may be selected to have small Schottky barrier (preferably, ohmic contact) with the channel material of the 3D structure (as described below). A small Schottky barrier may serve as a shorting channel between two adjacent pMTJ sensor layers in case a specific pMTJ sensor in a vertical stack is not selected for any write/read operation. Exemplary ohmic contact material, such as Ni—Au, Ti—Al, Ta—Au, etc., may demonstrate ohmic contact behavior with targeted channel materials.

The top layer (e.g. final layer) formed above the substrate during operation 504a may be a hardmask layer of the uppermost pMTJ sensor stack. In one approach, the hardmask material may be TaN, TiN. In various approaches, the hardmask material of the top layer may be deposited on the layers above the substrate using low temperature processes (e.g. below 400° C.) for example, low-pressure chemical-vapor deposition (LPCVD), sputter, evaporator, metal oxide chemical vapor deposition (MOCVD), atomic layer deposition (ALD), etc. In preferred approaches, the hardmask material may be deposited using ALD at lower temperature.

When all the desired layers for the magnetic device are formed, operation 504b involves defining an array of three-dimensional structures in the formed layers, wherein each three-dimensional structure comprises a stack of formed layers in a vertical direction above the substrate. A vertical direction may be defined as the z-direction orthogonal to an xy plane of the substrate. Further, each 3D structure has a bottom at the substrate, a top, and a sidewall extending between the bottom and the top, where a cavity region may be formed between the sidewall of each adjacent 3D structure. In one approach, operation 504b of defining an array of 3D structures of the formed layers may involve wet chemical etching. In another approach, operation 504b of defining an array of 3D structures of the formed layers may involve ion beam etching. In yet another approach, operation 504b of defining an array of 3D structures of the formed layers may involve plasma etching.

Operation 506 includes depositing a channel material on a surface of a least one sidewall of each 3D structure. In various approaches, the channel material may be one or more of the following channel materials: $ZnO_2$, $InZnO_2$, InZnGaO, etc. Operation 506 involves depositing the channel material at a lower temperature where the channel material may be in an amorphous phase. Preferably, the channel material may be in an amorphous phase rather than a polycrystalline phase in order to allow for uniform distribution of carrier mobility offered by an amorphous phase without suffering from reduced mobility from the amorphous phase. For example, amorphous $ZnO_2$ has a big s-orbital that allows s-orbital overlaps between adjacent atoms, thereby maintaining high mobility in an amorphous phase. Deposition of the channel material may include thermal/e-beam evaporator, radio frequency (RF) magnetron sputtering, MOCVD, ALD, etc.

Operation 508 involves depositing a gate dielectric material on the channel material on the surface of at least one sidewall of each 3D structure, thereby forming a thin-film transistor. The dielectric material may include, preferably, $HfO_2$, $ZrO_2$, $HfO_x$, $Al_2O_3$, etc. Deposition of the gate dielectric material may occur at low temperature, in a range of about 200° C. to about 250° C.

Looking to FIG. 5B, operation 510 involves forming a first isolation region in the cavity region above the substrate.

Operation 512 involves forming a first gate region above the first isolation region in the cavity region.

Operation 514 involves forming a second isolation region above the first gate region, where a $n^{th}$ gate region is formed above a (n+1) isolation region thereafter until a top of the array of 3D structures. The pMTJ at the top position of each 3D structure is the $n^{th}$ vertical level of 3D structure. The vertical levels of the 3D structure may be defined as $1 \leq k \leq n$, wherein 1 is the first vertical level above the substrate and n is the uppermost (e.g. top) vertical level of the each 3D structure, and $k^{th}$ vertical level is a level in between 1 and n. In various approaches, the $k^{th}$ gate region may be coupled to each $k^{th}$ pMTJ sensor of each 3D structure.

In some approaches, the isolation region may be initially deposited as a sacrificial layer, for example, the isolation region may include SiGe. In a following operation, the sacrificed SiGe of the isolation region may be replaced with silicon dioxide. In exemplary approaches, the isolation region may be silicon dioxide when the gate region is doped silicon.

In other approaches, the isolation region may be silicon. In exemplary approaches, the isolation region may be undoped silicon when the gate region includes a metal.

In some approaches, the gate region may be different from the semiconductor material of the source region. In another approach, the semiconductor material of each gate region may be the same as the semiconductor material of the source region.

In some approaches, the gate region may include at least one metal material, for example, W, TaN, TiN, Ru, etc.

In some approaches, each gate region may be coupled to the gate dielectric material on a surface of a sidewall of a pMTJ of each 3D structure.

In an exemplary approach, operations 510, 512, and 514 involve bottom-up processes (e.g., processes involving growing the structure). Examples of bottom up process may include epitaxial silicon growth of gate region material alternating with material for isolation region. The process described herein allows epitaxy growth of the gate region and alternating isolation region from the bottom, starting on the surface of the substrate, to the top of the array of 3D structures. Further, preferably, the semiconductor material of the alternating gate layers may be formed by chemical vapor deposition (CVD) at low temperatures to generate a low crystallinity of the semiconductor material, for example silicon with low crystallinity. Thus, the lower temperatures allow for preservation of the tall morphology of the pMTJ sensor stacks in the 3D structures and the integrity of the pMTJ sensors.

Method 600 as illustrated in FIGS. 6A-6F is an embodiment of method 500 for forming a magnetic device. The method 600 may be performed in accordance with the present invention in any of the environments depicted in FIGS. 1-5B, among others not specifically described, in various approaches. Of course, more or less operations than those specifically described in FIGS. 5A-6F may be included in method 600, as would be understood by one of skill in the art upon reading the present descriptions.

Figure 6A:
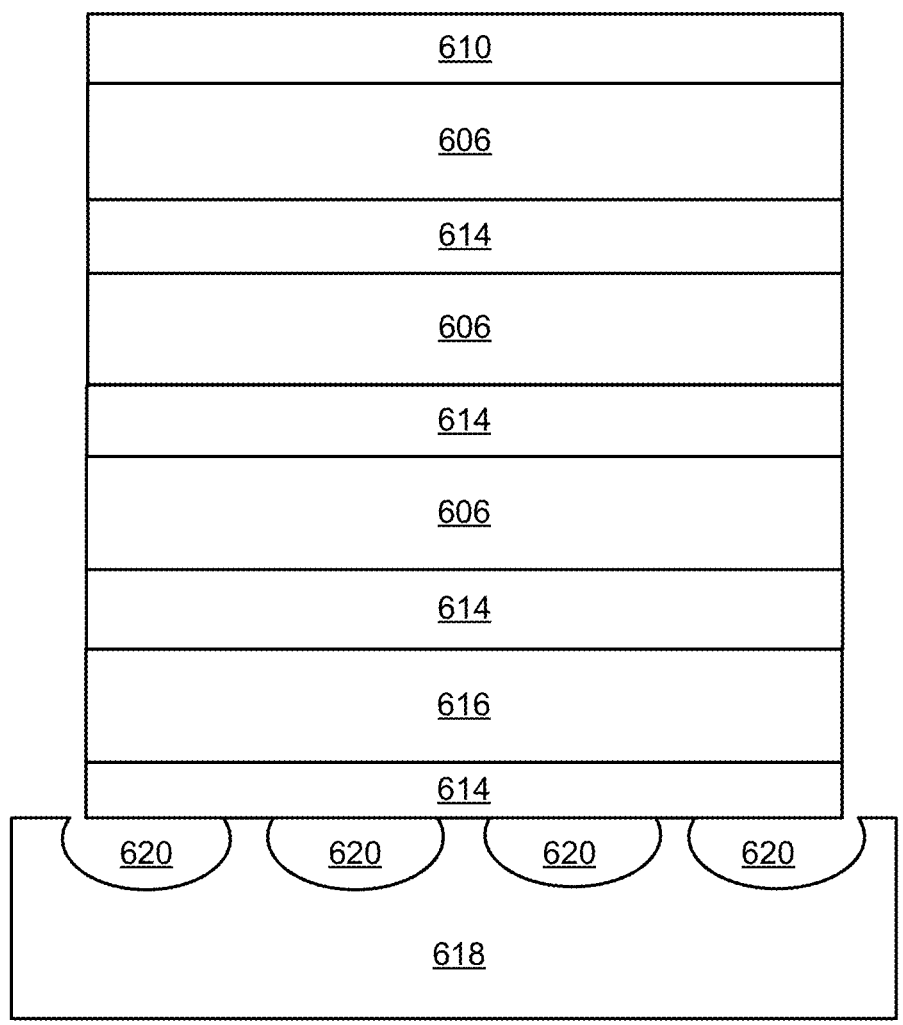
FIGS. 6A-6F are schematic representations of the operations of a method, in accordance with one embodiment.

FIG. 6A is an illustration of two operations 502, 504a of method 500, according to one embodiment. Method 600 shows forming a layer 620 including a first semiconductor material above a substrate 618, wherein the first semiconductor material has n-type conductivity.

As described above for operation 504a, an array of 3D structures may be formed by depositing layers above the substrate 618 in an order as follows: a first buffer layer 614, a dielectric layer 616, a buffer layer 614, a first pMTJ sensor 606, a third buffer layer 614, where the pMTJ sensor 606 layers are deposited alternately with the buffer layers 614. The uppermost layer of the layers may be a hardmask layer 610.

Figure 6B:
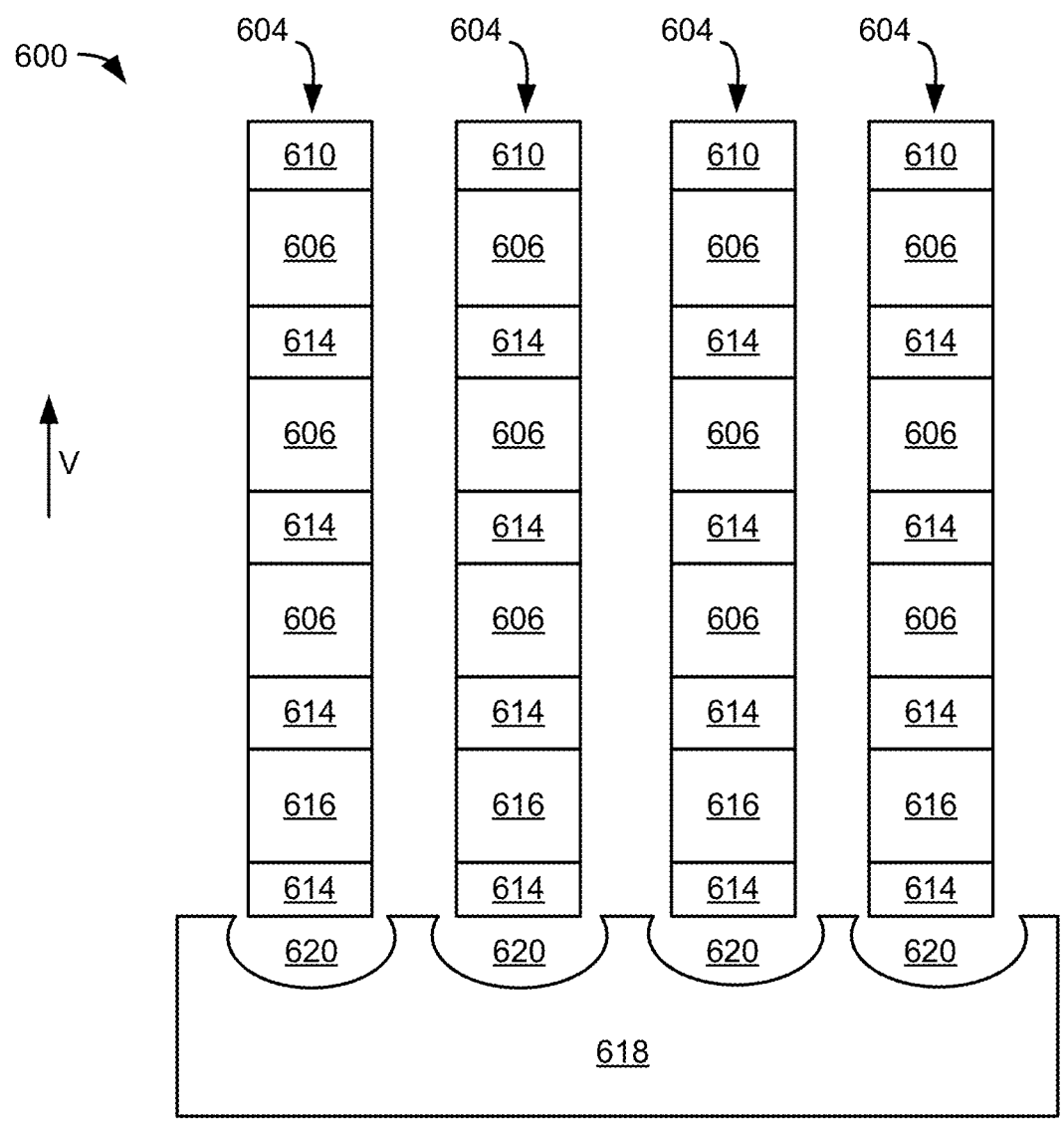

FIG. 6B is an illustration of operation 504b of method 500. As shown, an array of 3D structures 604 may be defined in formed layers. Each 3D structure 604 may be a stack of formed layers in the vertical V direction above the substrate 618.

Figure 6C:
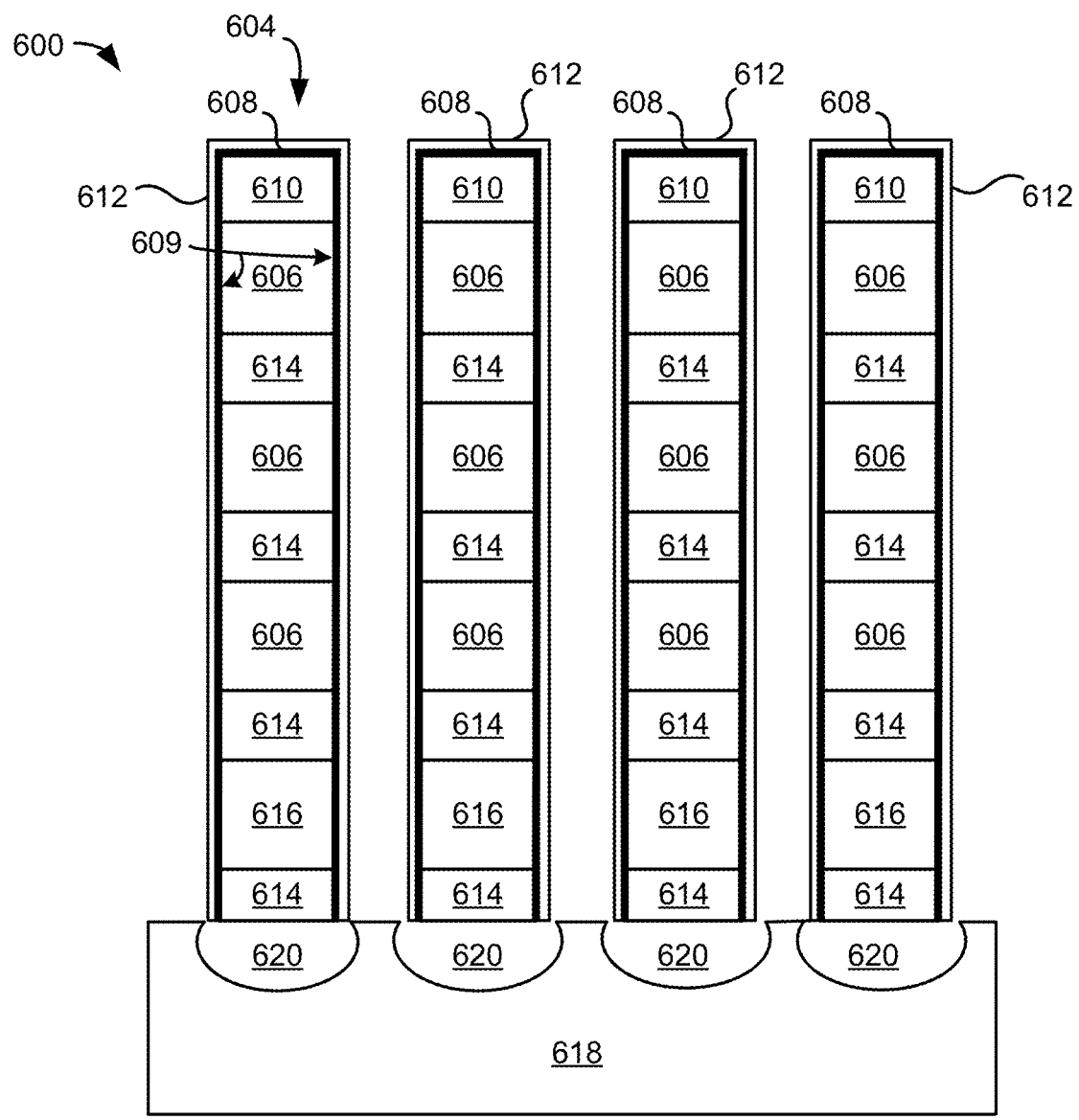

FIG. 6C is an illustration of operations 506 and 508 of method 500, according to one embodiment. As shown a channel material 608 may be deposited on the surface of at least one sidewall 609 of each 3D structure 604. A gate dielectric material 612 may be deposited on the channel material on the surface of at least one sidewall 609 of each 3D structure 604.

Figure 6D:
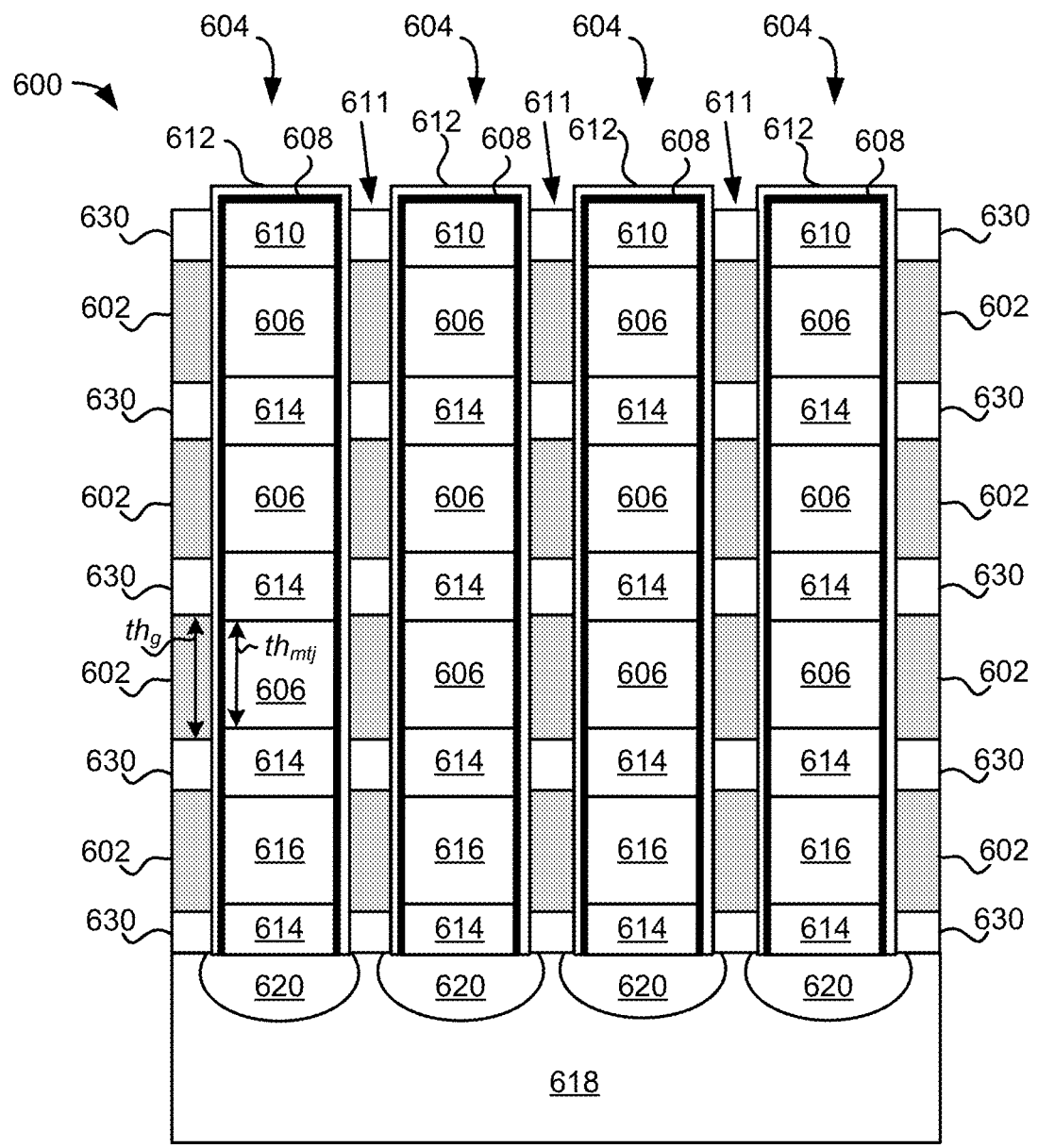

FIG. 6D is an illustration of operation 510 of method 500, according to one embodiment. A plurality of layers in the cavity region 611 above the substrate 618 may be formed. The layers may be formed orthogonal to the vertical direction of each 3D structure. The layers are formed in alternate above the substrate as follows: a layer of isolation region, a layer of gate region. In some approaches, the isolation region may be temporary and include a sacrificial semiconductor material. In some approaches, the gate region may include a semiconductor material with a conductivity, for example, a n-type conductivity. For example, the layer of temporary isolation region 630 may be a sacrificial material such as SiGe and the layer of gate region 602 may be doped-Si. The layers may be deposited with the first layer of the temporary isolation region 630 of SiGe deposited onto the substrate by epitaxy deposition by gas flow. A gate region 602 of doped-Si may be deposited on the first layer of a temporary isolation region 630 of SiGe by epitaxy deposition. The temporary isolation region 630 may initially include sacrificial material such as SiGe deposited on a layer of the gate region, and so the layers are deposited in an alternative manner.

In some approaches, a thickness of each $k^{th}$ gate region may be at least a thickness of each $k^{th}$ pMTJ sensor of each 3D structure. For example, as illustrated in FIG. 6D, the thickness of the gate layer $th_g$ may be defined by at least the thickness of the pMTJ sensor stack $th_{mtj}$. Further, the location of the gate region may be adjacent to each pMTJ sensor stack of each 3D structure. In some approaches, each $k^{th}$ gate region may be coupled to the $k^{th}$ pMTJ of each 3D structure in an x-direction of the array of 3D structures. The formation of the plurality of alternating layers may be deposited in a single chamber with alternating gas correlating to the layer to be deposited.

Figure 6E:
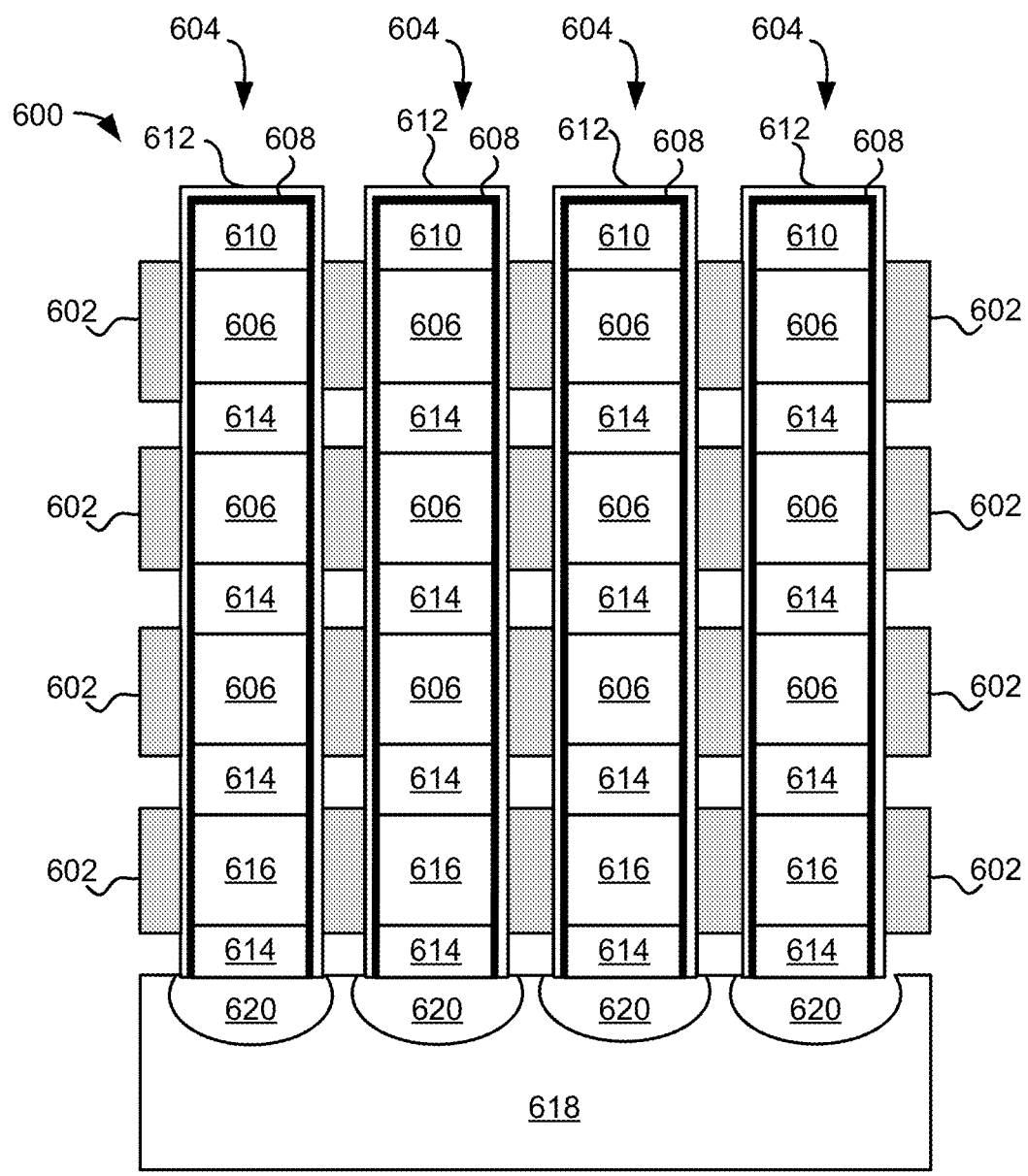

FIG. 6E is an illustration of the formation of the isolation region, according to one embodiment. In some approaches, the temporary isolation region 630 may be formed of sacrificial material, for example SiGe, and may be removed from the device by etching, etc. thereby leaving only the gate region 602 formed across the 3D structure 604.

Figure 6F:
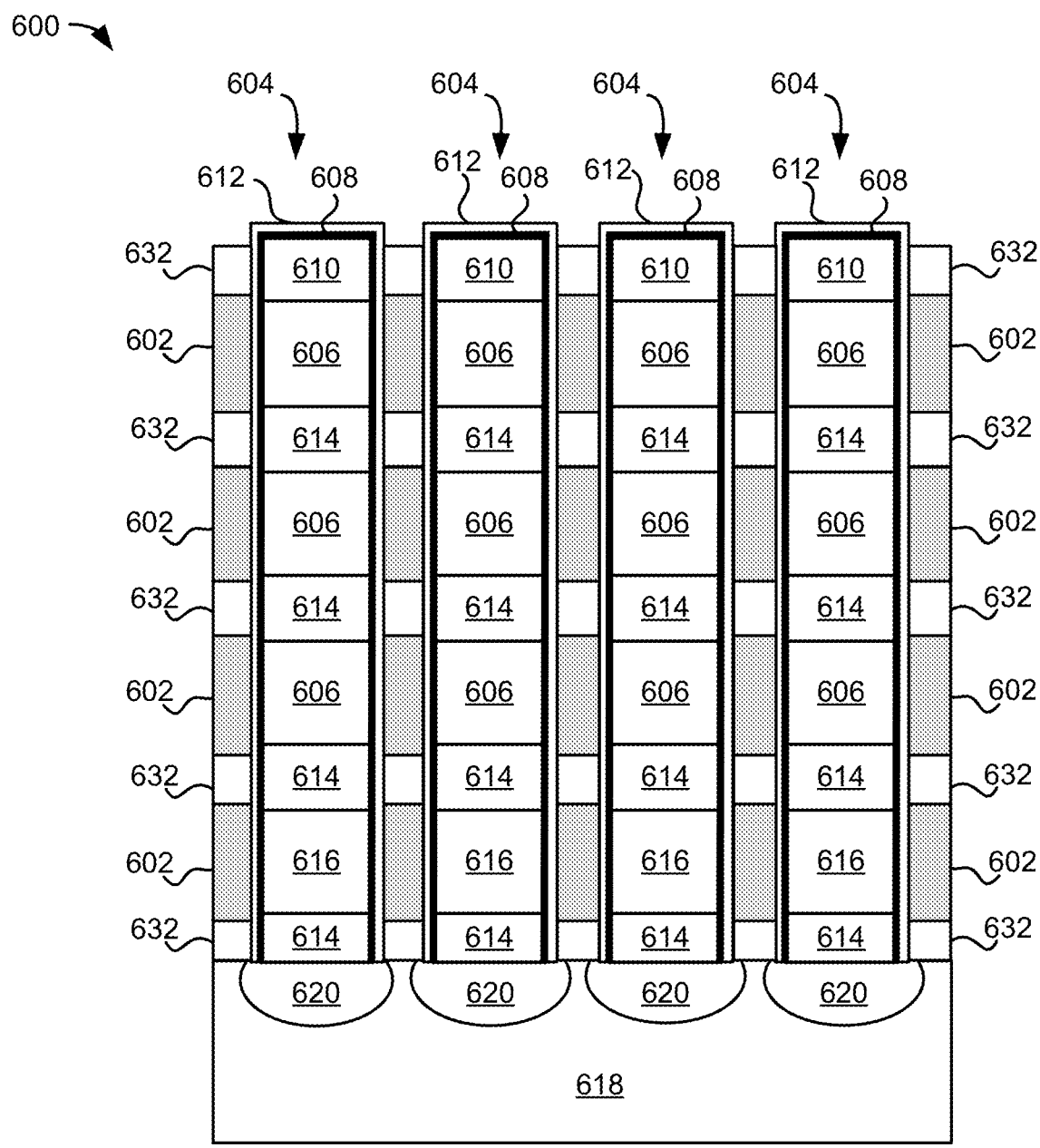

FIG. 6F is an illustration the formation of the functional isolation region 632, according to one embodiment. Layers of metal oxide, semiconductor material, etc., may be formed in the space defined above and below the gate region 602 in the cavity region 611 between the 3D structure 604. For example $SiO_2$ may be formed in the space defined above and below the gate region 602.

In one approach as depicted in FIG. 7A, a method 700 to form a 3D structure above a substrate following back end of line (BEOL) processes at the kth level of a magnetic device, a layer 735 may be formed by patterning hardmask material 740, for example TaN, and a semiconductor material 742, for example amorphous silicon. For example, the silicon may be crystallized using metal-induced crystallization.

As illustrated in FIG. 7B, according to one embodiment as described herein, an nth level of a magnetic device including each 3D structure 704 formed with buffer layers 714 alternating with pMTJ sensor 706 stacks, and a dielectric layer 716 above the substrate, and a hardmask layer 710 formed at the top of the 3D structure 704. According to one embodiment, the gate regions 702 may be formed across the 3D structures at the location of the pMTJ sensor 706 stacks of each 3D structure and the layer 732 of $SiO_2$ above and below the gate region 702. According to method 700, using the same techniques as described herein, poly-gate and oxide layers may be grown in alternate.

Figure 8:
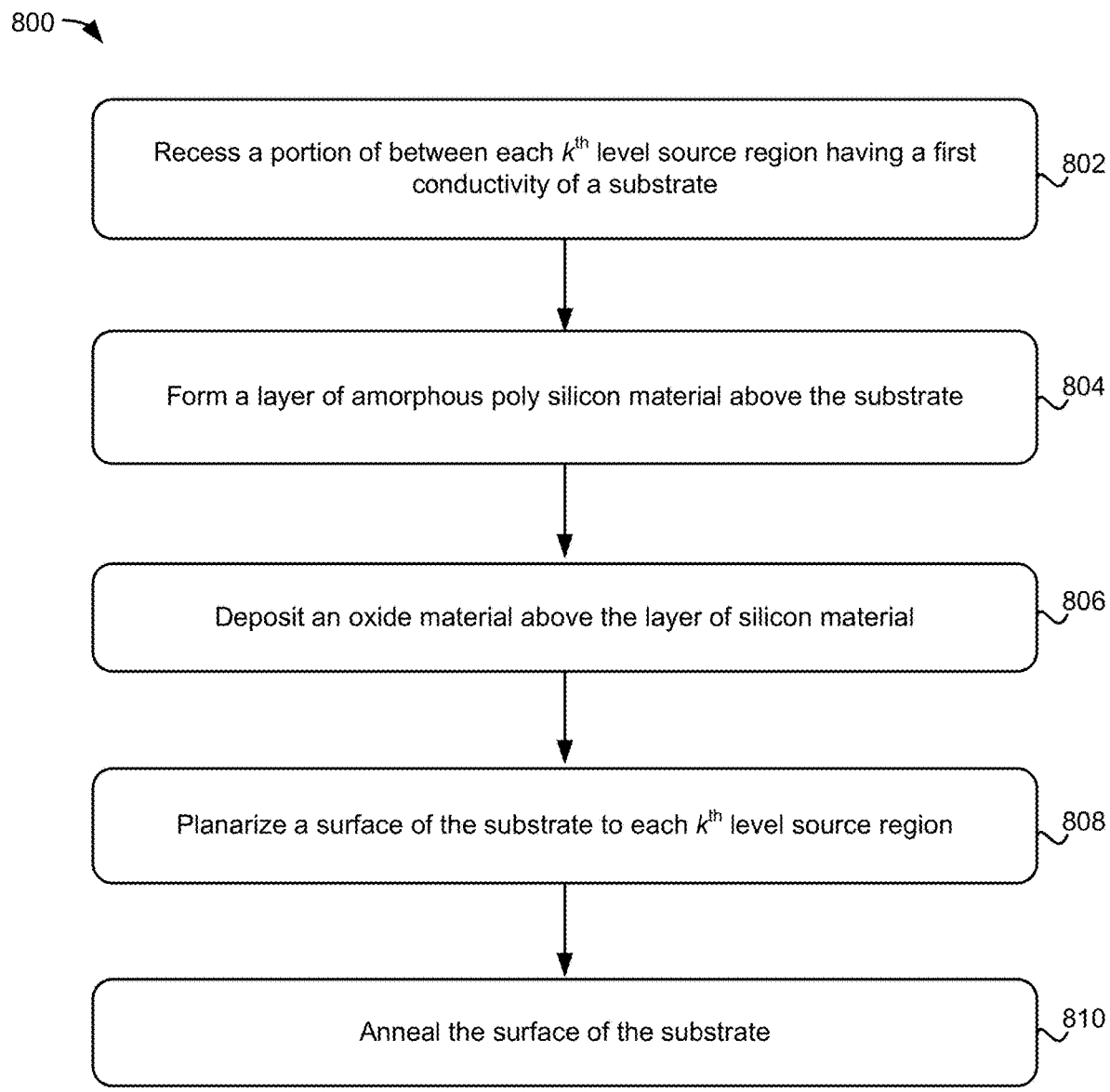
FIG. 8 is a flow chart of a method, according to one embodiment.

Now referring to FIG. 8 a method 800 for forming a substrate for BEOL processes of forming a magnetic memory device, according to one embodiment. The method 800 may be performed in accordance with the present invention in any of the environments depicted in FIGS. 1-7, among others not specifically described, in various approaches. Of course, more or less operations than those specifically described in FIG. 8 may be included in method 800, as would be understood by one of skill in the art upon reading the present descriptions.

Method 800 describes an embodiment for forming a substrate to be used for BEOL formation of a magnetic memory device as described herein. Operation 802 of method 800 includes recessing a portion between each $k^{th}$ level source region having a first conductivity of a substrate. The $k^{th}$ level source region may be defined as a source region in between a first source region of a first array of 3D structures and a $n^{th}$ level source region, e.g. at the top position of the magnetic memory device having multiple arrays of 3D structures. At the top position of each 3D structure is the $n^{th}$ vertical level of the 3D structure. In some approaches, the $k^{th}$ level source region may be formed by dual-damascene BEOL processes using conventional techniques. The $k^{th}$ level source region may include $k^{th}$ level metal, for example, but not limited to, TaN, W, TiW, Cu, etc.

The portion of the substrate positioned between the $k^{th}$ level source region in the xy plane of the substrate may include silicon oxide. In some approaches, operation 802 may involve recessing the silicon dioxide from the surface of the $k^{th}$ level source region to a level below the surface of the metal source region.

Operation 804 includes forming a layer of silicon material above the substrate, where the silicon material may be amorphous.

Operation 806 includes depositing an oxide material above the layer of silicon material.

Operation 808 includes planarizing a surface of the substrate to each $k^{th}$ level source region. In some approaches, planarizing the surface of the substrate that includes oxide material on a layer of amorphous silicon material to the surface of the metal of the $k^{th}$ level source may involve chemical mechanical planarization (CMP) techniques.

Operation 810 includes annealing a surface of the substrate, where the surface of the substrate may have portions of $k^{th}$ level source region having metal alternating with portions of silicon. Methods to anneal the surface may include laser annealing the surface to generate a single crystalline silicon structure on the surface of the substrate.

Following completion of method 800, the formed substrate may be used to form an array of 3D structures following a method described herein (see FIGS. 5A and 5B).

Figure 9:
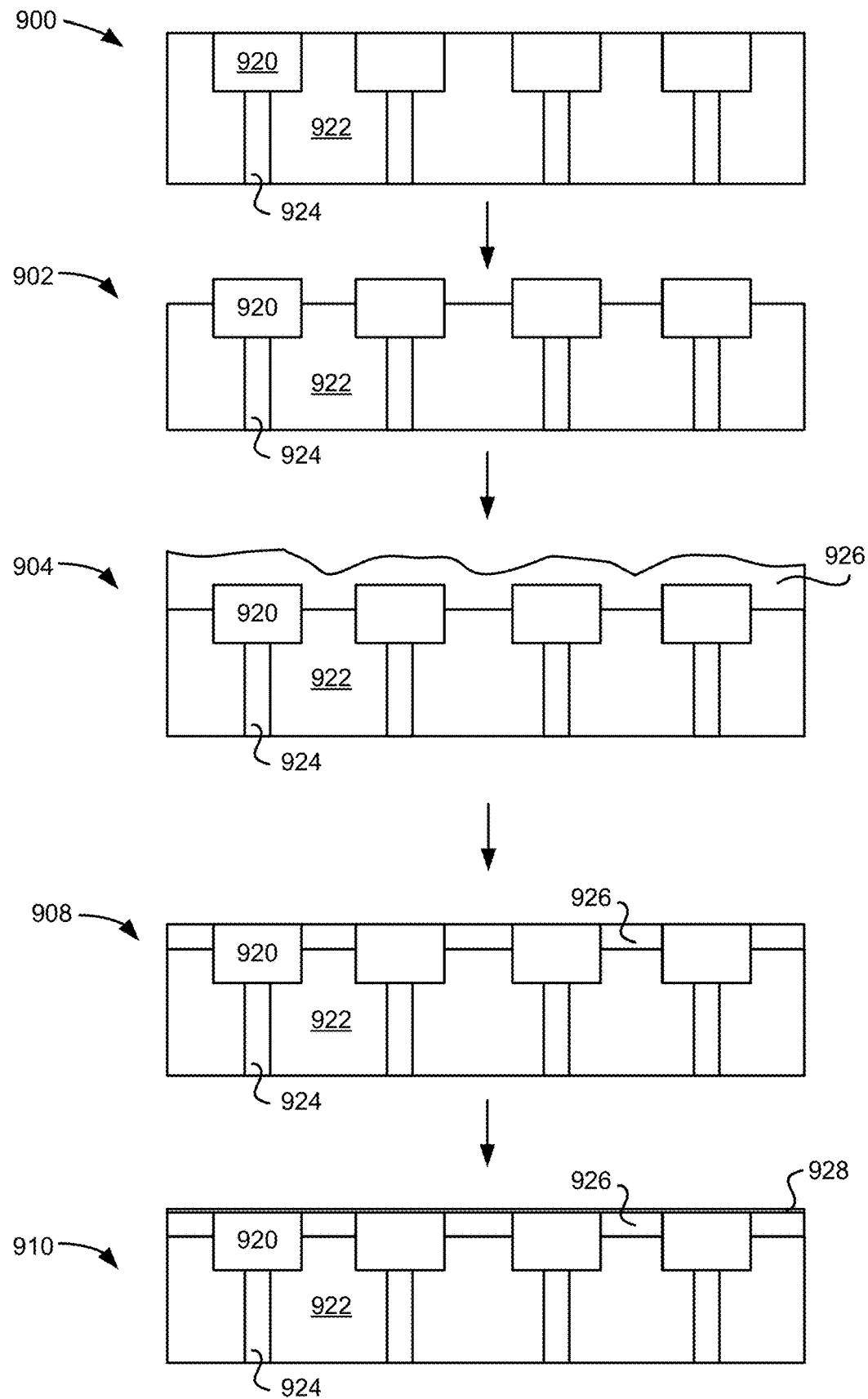
FIG. 9 is a schematic representation of a method, according to one embodiment.

FIG. 9 illustrates a schematic representation of method 800, according to one embodiment. The substrate 900 includes portions of $k^{th}$ level source region 920 having a first conductivity, including a metal, for example TaN, W, TiW, Cu, etc. The $k^{th}$ level source region 920 may be connected to the $k^{th}$ level via a level connector 924. The level connector 924 may include metal, for example, W, Cu, etc. The substrate 900 includes portions of silicon dioxide 922 between the $n^{th}$ level source region 920.

Operation 902, as shown in FIG. 9, includes recessing the portions of silicon dioxide 922 in the wordline direction to below the surface of the $k^{th}$ level source region 920.

Operation 904 includes depositing amorphous/poly-phase silicon 926 with polygrains above the recessed portions of silicon dioxide 922 and the surface of $k^{th}$ level source region 920.

Operation 908 includes planarizing the substrate following oxide deposition. Using conventional techniques such as CMP the upper surface of the substrate may be planarized to the upper surface of the $k^{th}$ level source region 920, thereby providing a substantially flat surface of the substrate having portions of amorphous/poly-phase silicon 926 and $k^{th}$ level source region 920.

Operation 910 includes annealing the surface of the substrate by laser annealing techniques to form a single-crystalline silicon 928 above the portions of amorphous/poly-phase silicon 926 and $k^{th}$ level source region 920.

Figure 10:
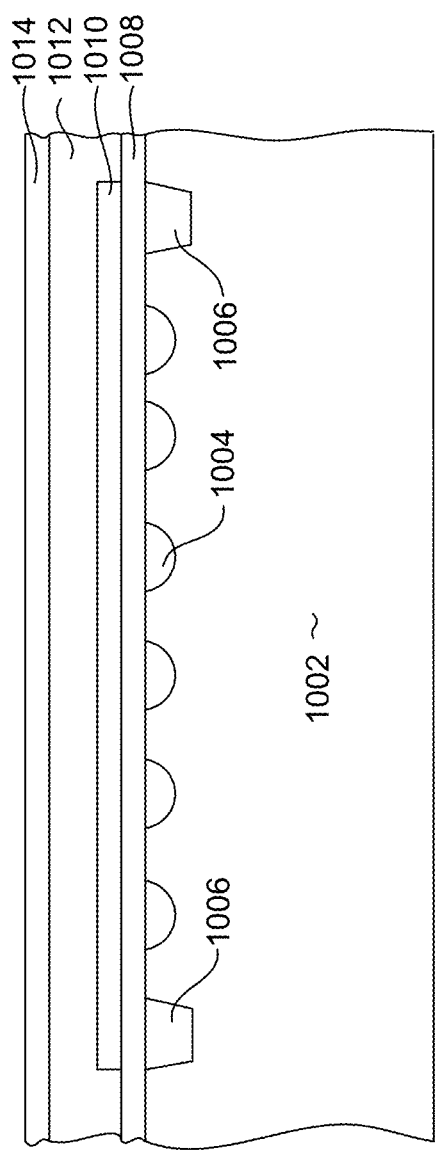
FIGS. 10-20 are schematic representations of a wafer in various intermediate stages of manufacture illustrating a method for manufacturing a magnetic memory array having epitaxially grown transistors for source line selection.

FIGS. 10-15 show a wafer in various intermediate stages of manufacture in order to illustrate a method for manufacturing epitaxially grown transistors for source line selection in a magnetic memory array. With reference to FIG. 10, a substrate 1002 is provided. The substrate 1002 can be a material such as Si as part of a silicon wafer. A plurality of n+ doped regions 1004 are formed into a surface of the substrate 1002. The n+ doped regions 1004 can be formed by locally doping selected regions of the substrate 1002 with a doping material such as As or P. Isolation trenches 1006 can be formed to electrically isolate a row of n+ doped regions 2004 from other rows of n+ doped regions. The isolation trench 1006 can be formed of an electrically insulating material. A dielectric layer 1008 is deposited over the surface of the substrate 1002, over the n+ doped regions 1004 and over the isolation trenches 1006. The dielectric layer 1008 can be a material such as SiOx or SiNx.

With continued reference to FIG. 10, a gate material layer 1010 is formed over the dielectric layer. The gate material 1010 can be a material such as W, TiNi, TaN, TiN, and Ti, and is formed to define a word line such as previously described. A dielectric material 1012 is deposited over the gate material 1010. The dielectric material 1012 is preferably an oxide, such as silicon oxide or a metal oxide (such as $HfO_2$, $Al_2O_3$, etc.), preferably silicon oxide. A layer of material that is resistant to chemical mechanical polishing (CMP stop layer) 1014 is deposited over the dielectric layer 1012. The CMP stop layer 1014 is preferably a nitride, such as SiNx.

Figure 11:
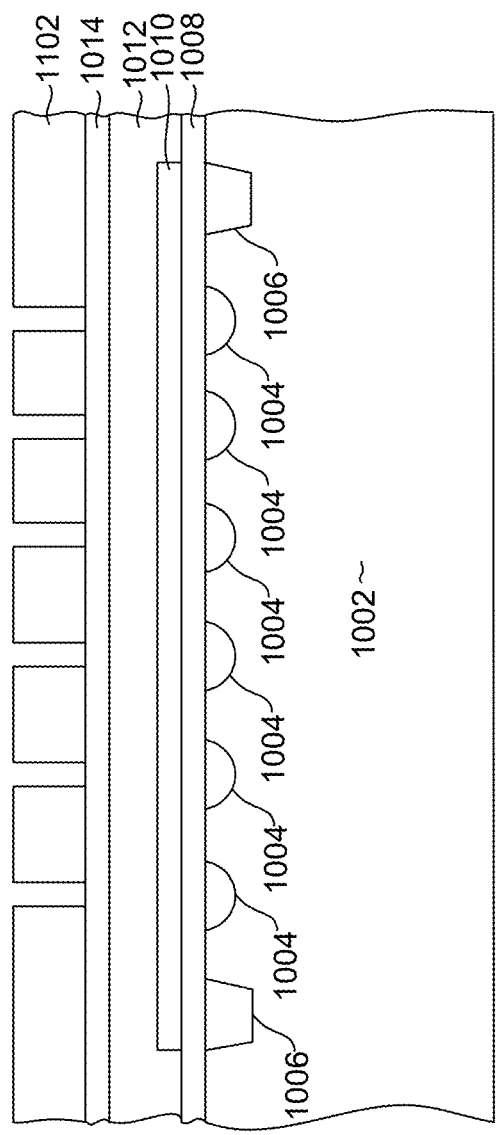
Figure 12:
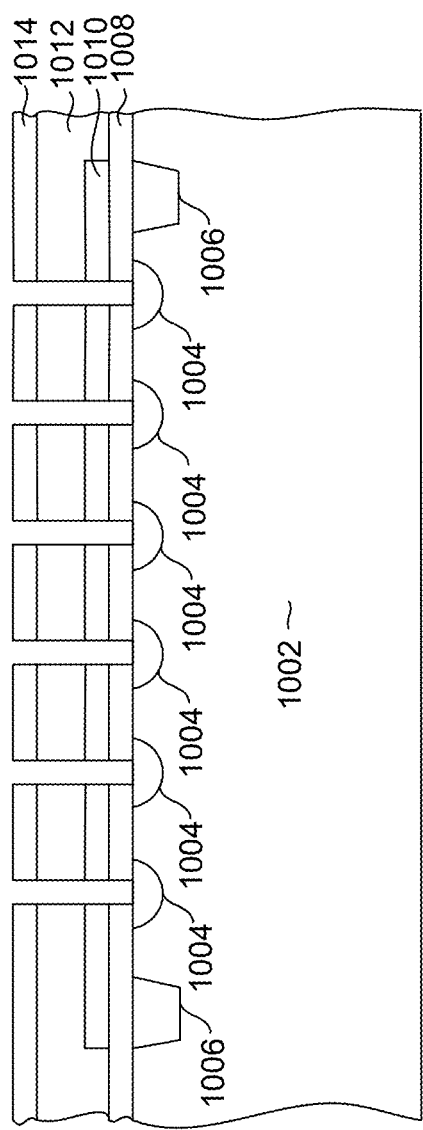

Then, with reference to FIG. 11, a mask structure 1102 is deposited over the CMP stop layer. The mask 1102 can include various layers, such as but not limited to a hard mask layer an anti-reflective layer and a patterned photoresist layer. The mask 1102 is configured with openings that will define semiconductor structures, as will be seen.

A material removal process such as reactive ion etching or ion milling is then performed to transfer the image of the mask structure 1102 onto the underlying layers 1108, 1010, 1012, 1014 by removing portions of these layers that are exposed through the openings in the mask structure 1102. After the material removal process has been performed sufficiently to reach the n-doped regions 1004, the mask structure 1102 can be removed, leaving a structure such as that shown in FIG. 12.

Figure 13:
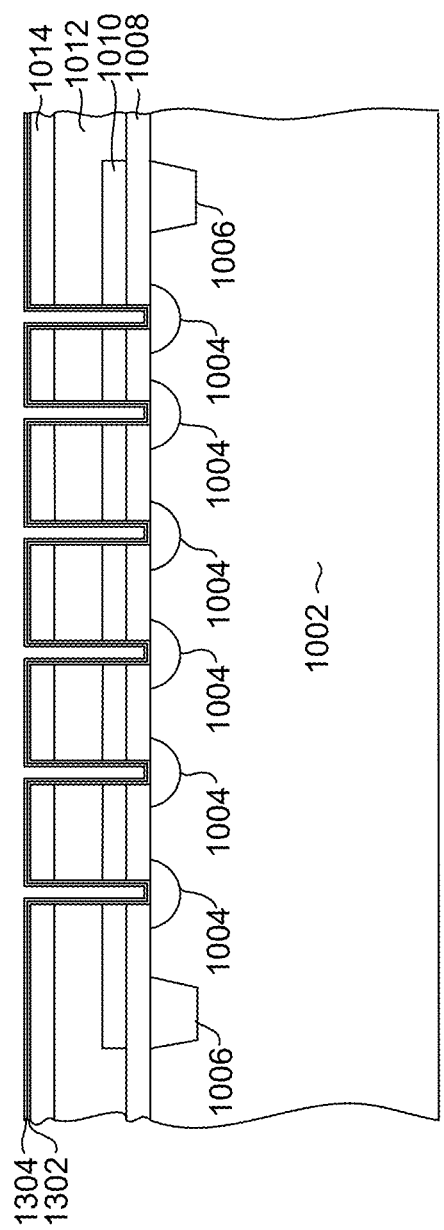
Figure 14:
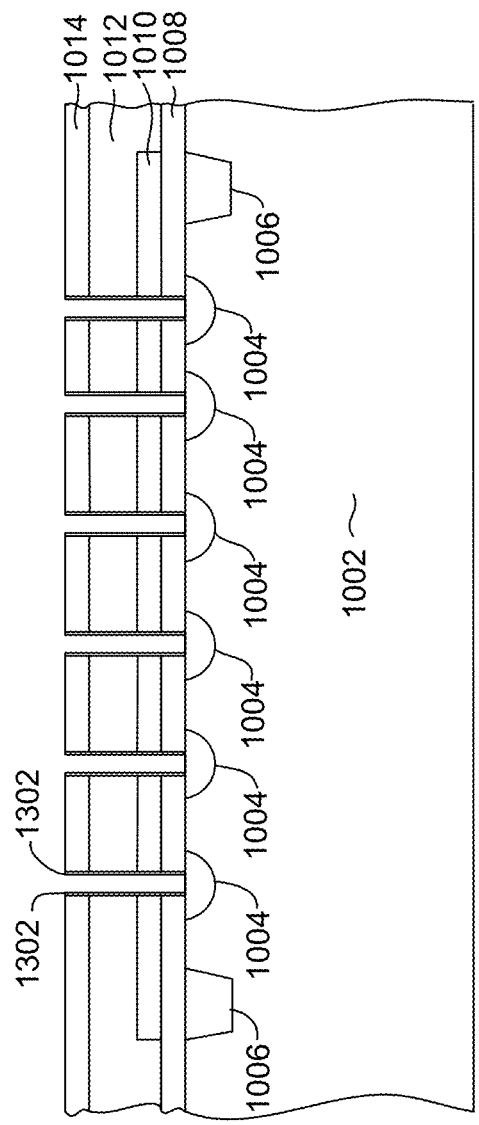

Then, with reference to FIG. 13, a gate dielectric material 1302, such as $SiO_2$, $HfO_2$, $Al_2O_3$ or $ZrO_2$, is deposited by a conformal deposition process such as atomic layer deposition (ALD) or chemical vapor deposition (CVD). A protective layer 1304 is then deposited over the gate dielectric layer 1302. The protective layer 1304 is preferably a material having a desired etch selectivity so that it can be removed by etching (such as reactive ion etching) while leaving the underlying gate dielectric material 1302 substantially intact. For example, if the gate dielectric material 1302 is $SiO_2$ or $HfO_2$, the protective layer 1304 could be $Si_3N_4$. The protective layer 1304 is preferably deposited by a conformal deposition process such as atomic layer deposition (ALD) or chemical vapor deposition (CVD).

An anisotropic material removal process such as ion milling is then performed to preferentially remove horizontally disposed portions of the gate dielectric layer 1302 and protective layer 1304. This material removal process is performed sufficiently to remove the gate dielectric and protective layer 1302, 1304 at the bottom of the openings so as to expose the n+ doped regions 1004 of the substrate 1002. A material removal process such as reactive ion etching is then performed to remove the protective layer 1304, leaving the gate dielectric and forming a structure such as that shown in FIG. 14. The reactive ion etching is preferably performed using a chemistry that preferentially removes the material of the protective layer 1304.

After gate dielectric layer 1302 has been removed at the bottoms of the openings, a surface cleaning can be performed on the surface of the remaining gate dielectric 1302. The surface cleaning can be performed as one or more iterations of oxidation and etching steps. After the surface cleaning, the surface of the gate dielectric layer 1302 can be passivated, such as by exposure to nitrogen.

Figure 15:
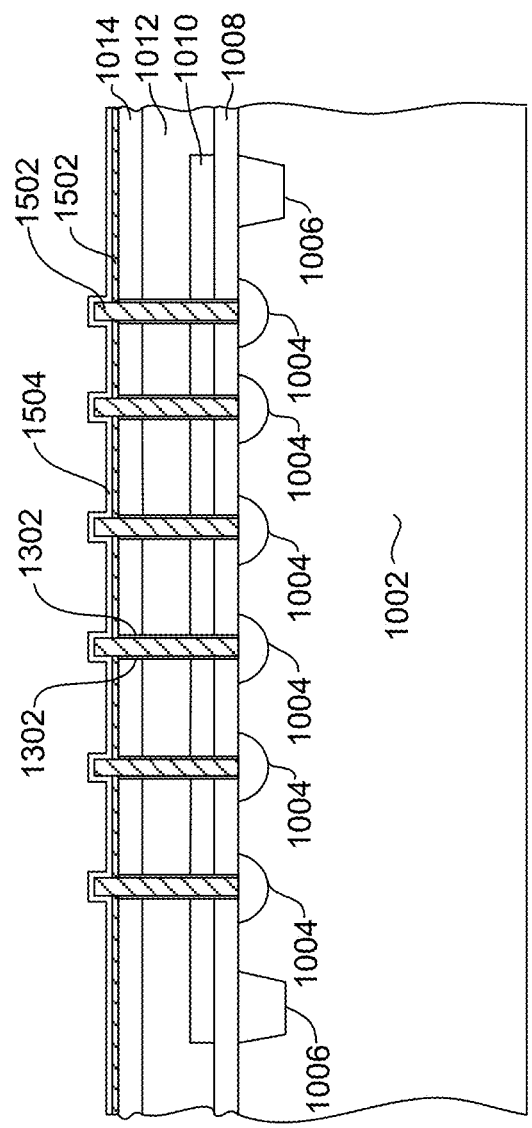
Figure 16:
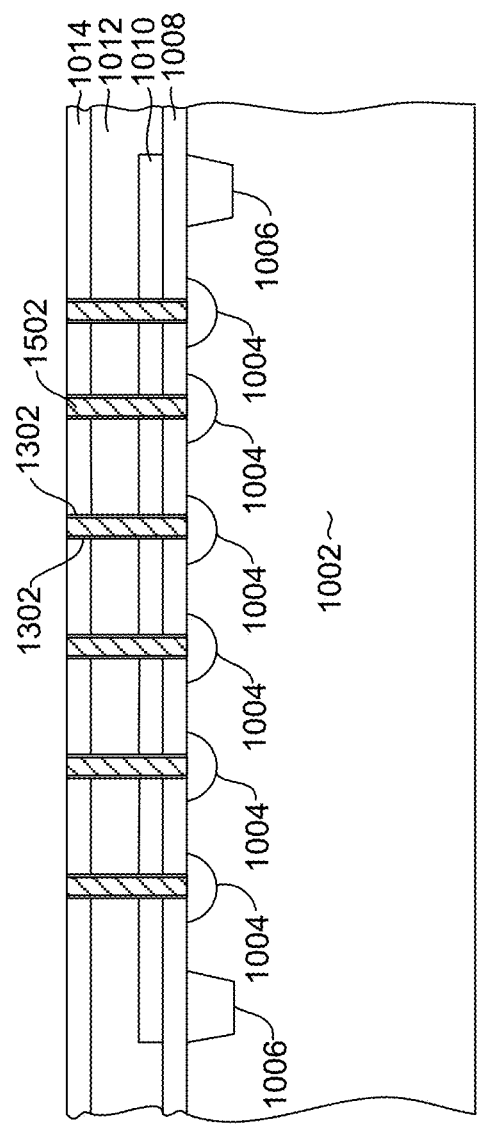

Then, with reference to FIG. 15, epitaxial silicon 1502 is grown to fill the previously formed openings. In addition to filling the openings, the epitaxial silicon 1502 extends above the openings and may also cover the outer surface of the layer 1014, etc., as shown in FIG. 15. Then, an optional layer of oxide 1504 may be deposited. A chemical mechanical polishing is then performed to remove excess silicon, leaving a structure as shown in FIG. 16. The CMP process is terminated when the nitride CMP stop layer 1014 is reached or may be continued slightly into the nitride CMP stop layer 1014. The optional, additional oxide layer 1504 can be useful to prime the CMP process resulting in improved CMP process results. The optional additional oxide layer 1504 could be a material such as $SiO_2$ or one of various other metal oxides, such as $HfO_2$, $Al_2O_3$, etc.

Figure 17:
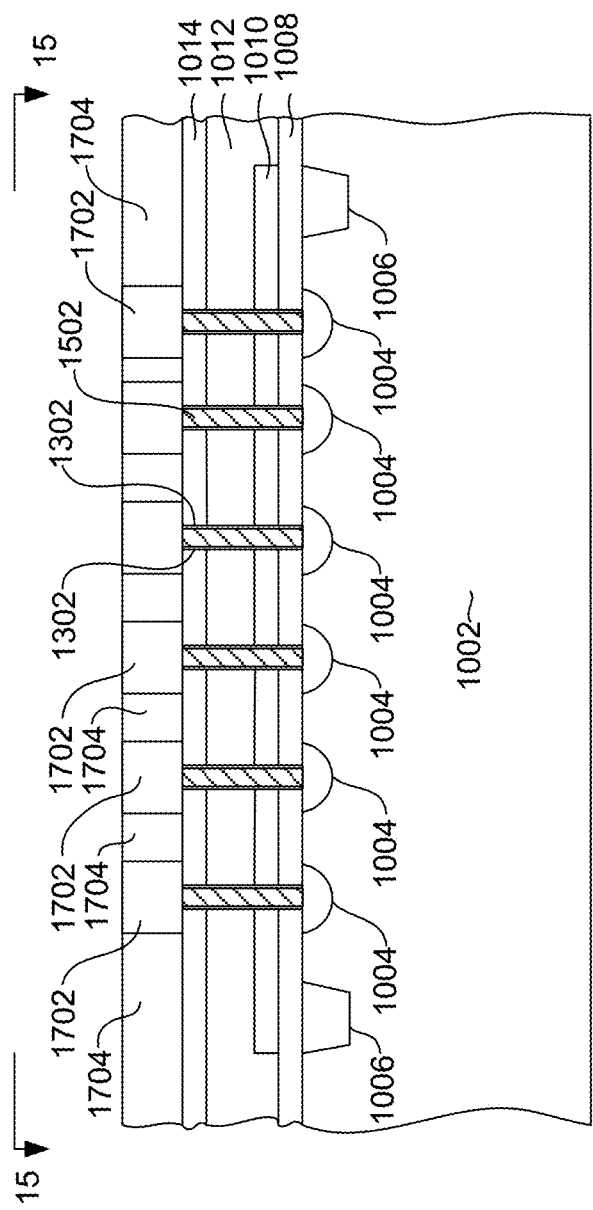

Then, with reference to FIG. 17, a series of electrically conductive metal contacts structures 1702 are formed over each of the epitaxial Si structures 1502 and dielectric layers 1302. The contact structures 1702 are embedded in an oxide layer such as $SiO_2$ and, at this point in the process, the contacts 1702 and surrounding oxide 1704 may have coplanar upper surfaces. The contact and oxide structures 1702, 1704 can be formed by a process that includes, first forming the contact structures 1702, such as by forming a mask and electroplating or sputter depositing an electrically conductive material such as Cu, Au, Ag, etc. Then, a layer of oxide material 1704 can be deposited over the formed contact structures 1702. The oxide layer 1704 can be deposited by sputter deposition of a material such as $SiO_2$. Then, a chemical mechanical polishing process can be performed to expose the contacts 1702 through the oxide 1704, leaving a planar structure such as that shown in FIG. 17.

Figure 18:
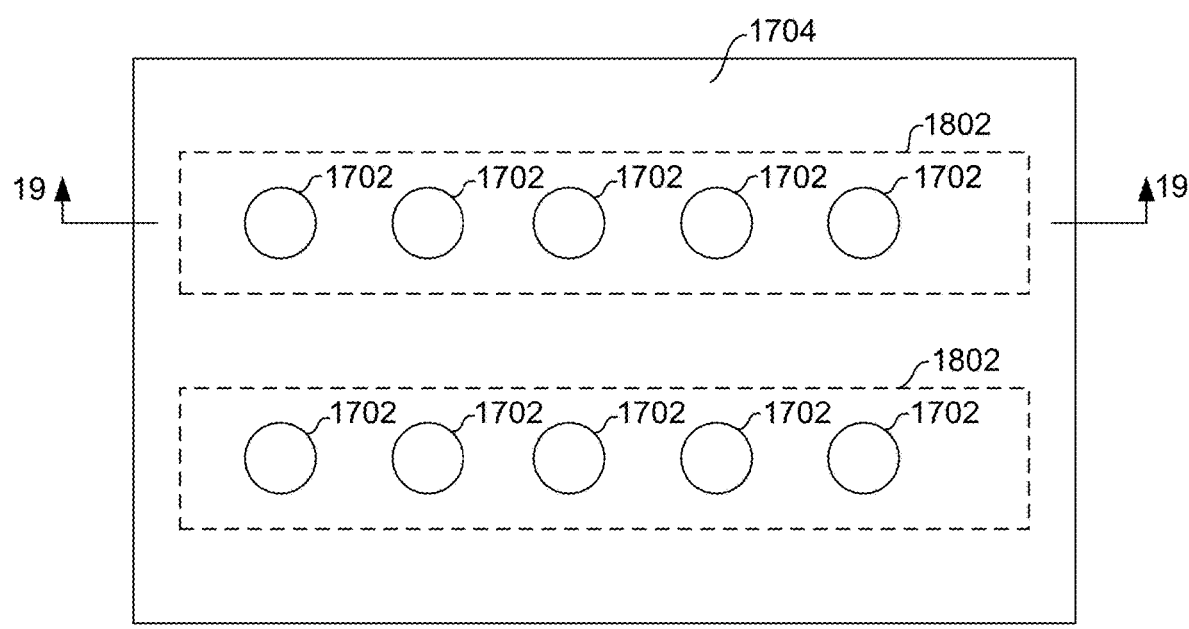

FIG. 18, shows a top-down view as seen from line 18-18 of FIG. 17. After forming the contacts 1702 and surrounding oxide 1704, an etching process is performed to remove oxide material 1704 only within the regions enclosed by the dashed lines 1802. This can be accomplished by forming a mask over the surface of the contacts 1702 and surrounding oxide 1704, wherein the mask has openings in the regions defined by the dashed lines 1802. The etching process can be a reactive ion etching that is performed using a chemistry that is chosen to preferentially remove the oxide material 1704, leaving the contacts 1702 substantially intact. This etching forms a recessed trench in the oxide layer 1704 having a shape such as indicated by the dashed line 1802.

Figure 19:
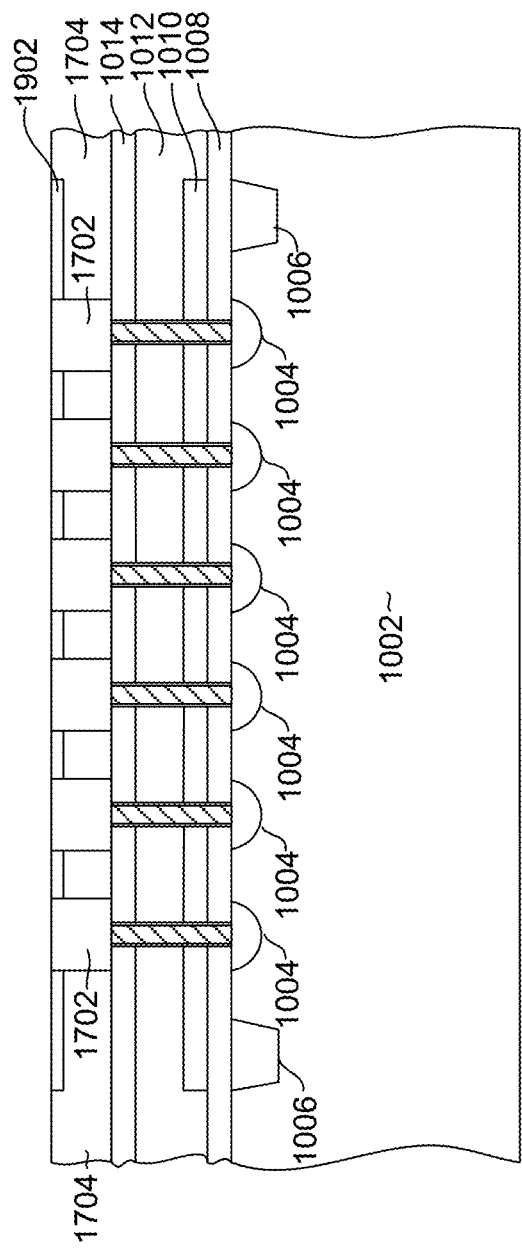

After the etching process has been performed, a layer of amorphous poly-phase silicon 1902 is deposited, followed by a chemical mechanical polishing (CMP), leaving a structure as shown FIG. 19. FIG. 19 is a cross sectional view as seen from line 19-19 of FIG. 18. As shown in FIG. 19, the CMP process is performed sufficiently to expose the electrical contacts 1702 through the tops of the deposited silicon 1902. A laser annealing can then be performed to cause the deposited silicon 1902 to form a single crystalline structure.

Figure 20:
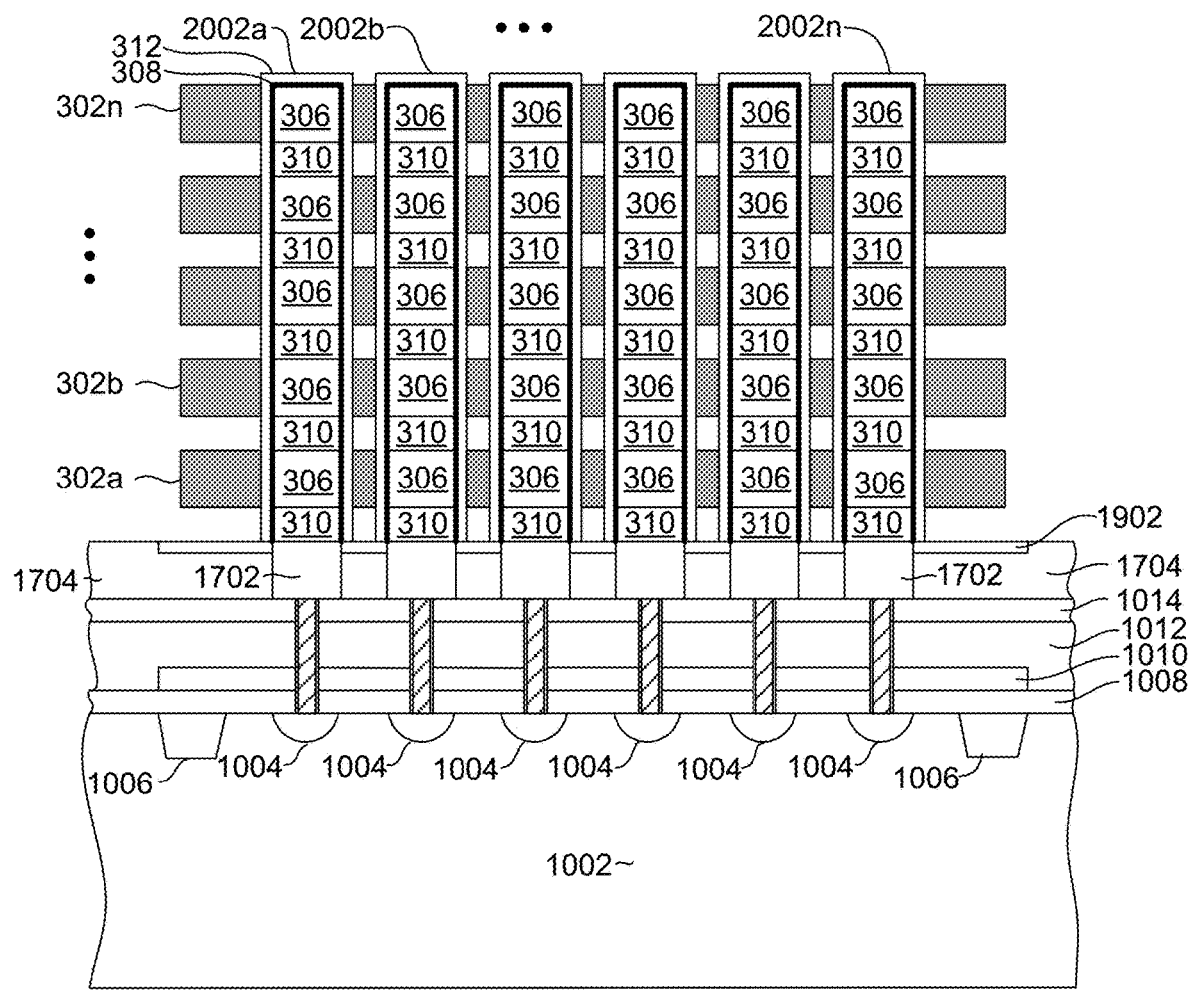

The above process results in an array of vertically disposed epitaxially formed transistors. After these transistors have been formed, with reference to FIG. 20, an array of three dimensional MRAM elements 2002 can be formed over each of the transistor elements. These MRAM elements 2002 can be similar to the MRAM elements 304 described above with reference to FIG. 3C, except that the bottom transistor described in FIG. 3E is replaced by the above described epitaxially grown transistor structures. This use of the above described epitaxially grown transistor structure prevents current leakage between various memory element pillars along a source line.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic random access memory array, comprising:
a substrate having a sourceline formed therein;
a pillar structure between the sourceline on one side and a bitline on an opposite second side in a vertical direction, the pillar structure comprising a plurality of homogeneous magnetic memory elements stacked over one another along the vertical direction, each magnetic memory element comprising a magnetic reference layer, a magnetic free layer, and a non-magnetic, electrically-insulating magnetic barrier layer positioned between the reference layer and the free layer; and
a transistor located between the sourceline and the pillar structure, the transistor being functional to selectively electrically connect the pillar structure with the sourceline;
wherein the transistor further comprises:
a column of epitaxial semiconductor material having an outer side, the column of epitaxial semiconductor material forming a channel of the transistor structure;
a gate dielectric surrounding the column of epitaxial semiconductor material and contacting the side of the column of epitaxial semiconductor material; and
an electrically conductive gate structure surrounding the gate dielectric and the column of epitaxial semiconductor material such that the gate dielectric separates the electrically conductive gate structure from the column of epitaxial semiconductor material,
wherein the gate structure comprises a plurality of gate regions separated from one another along the vertical direction, each of the plurality of gate regions surrounding a sidewall of a corresponding one of the plurality of homogeneous magnetic memory elements in a horizontal direction.

2. The magnetic random access memory array as in claim 1, wherein the pillar structure further comprises at least one buffer layer separating the plurality of homogeneous magnetic memory elements from one another.

3. The magnetic random access memory array as in claim 1, wherein the column of epitaxial semiconductor material comprises Si.

4. The magnetic random access memory array as in claim 1, wherein the electrically conductive gate structure comprises one or more of W, TiNi, TaN, TiN, and Ti.

5. The magnetic random access memory array as in claim 1, wherein the electrically conductive gate structure comprises one or more of W, TiNi, TaN, TiN, and Ti and the gate dielectric comprises one or more of SiO2, HfO2, Al2O3 and ZrO2.

6. The magnetic random access memory array as in claim 1, wherein the sourceline comprises an n+ doped region formed in the substrate.

7. The magnetic random access memory array as in claim 6, wherein the substrate comprises a semiconductor material.

8. The magnetic random access memory array as in claim 1, wherein the substrate comprises Si and the sourceline comprises an n+ doped region formed in the Si.

9. The magnetic random access memory array as in claim 2, wherein the at least one buffer layer comprises one or more of Ni, Au, Pt, or Al.

10. A magnetic random access memory array comprising:
a substrate;
a sourceline formed on the substrate;
a plurality of pillar structures formed over the substrate, each of the pillar structures being disposed between the sourceline on one side and a bitline on an opposite second side in a vertical direction and comprising a plurality of homogeneous magnetic memory elements stacked over one another along the vertical direction, each of the magnetic memory elements comprising a magnetic reference layer, a magnetic free layer, and a non-magnetic, electrically-insulating magnetic barrier layer positioned between the reference layer and the free layer; and
a plurality of transistors each transistor being located between the sourceline and one of the plurality of pillar structures, the transistor being functional to selectively electrically connect the pillar structure with the sourceline;
wherein the transistors each further comprise:
a column of epitaxial semiconductor material forming a channel of the transistor, the column of epitaxial semiconductor having an outer side;
a gate dielectric surrounding the column of epitaxial semiconductor material and contacting the side of the column of epitaxial semiconductor material; and
an electrically conductive gate structure surrounding the gate dielectric and the column of epitaxial semiconductor material such that the gate dielectric separates the annular electrically conductive gate structure from the column of epitaxial semiconductor material,
wherein the gate structure comprises a plurality of gate regions separated from one another along the vertical direction, each of the plurality of gate regions surrounding a sidewall of a corresponding one of the plurality of homogeneous magnetic memory elements in a horizontal direction.

11. The magnetic random access memory array as in claim 10, wherein each of the plurality of pillar structures further comprises at least one buffer layer separating the plurality of homogeneous magnetic memory elements.

12. The magnetic random access memory array as in claim 10, wherein the column of epitaxial semiconductor material comprises Si.

13. The magnetic random access memory array as in claim 10, wherein the electrically conductive gate structure comprises one or more of W, TiNi, TaN, TiN, and Ti.

14. The magnetic random access memory array as in claim 10, wherein:
the column of epitaxial semiconductor material comprises Si;
the electrically conductive gate structure comprises one or more of W, TiNi, TaN, TiN, and Ti; and
the gate dielectric comprises one or more of SiO2, HfO2, Al2O3 and ZrO2.

* * * * *